(12) United States Patent
Diboine et al.

(10) Patent No.: US 11,166,388 B2
(45) Date of Patent: Nov. 2, 2021

(54) DISPLAY APPARATUS FOR VEHICLE

(71) Applicant: LG ELECTRONICS INC., Seoul (KR)

(72) Inventors: Romain Diboine, Seoul (KR); In Koo Shim, Seoul (KR); Seung Mo Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/902,523

(22) Filed: Jun. 16, 2020

(65) Prior Publication Data

US 2021/0212221 A1 Jul. 8, 2021

(30) Foreign Application Priority Data

Jan. 8, 2020 (KR) .................. 10-2020-0002706

(51) Int. Cl.
   *G09F 11/32* (2006.01)
   *H05K 5/00* (2006.01)
   (Continued)

(52) U.S. Cl.
   CPC ........... *H05K 5/0017* (2013.01); *B60K 35/00* (2013.01); *F16H 19/04* (2013.01); *F16H 19/06* (2013.01);
   (Continued)

(58) Field of Classification Search
   None
   See application file for complete search history.

(56) References Cited

U.S. PATENT DOCUMENTS 8,649,161 B2 * 2/2014 Kato ................ H04N 21/41422
                                                          361/679.01
9,459,653 B2 * 10/2016 Katsunuma ........ F16M 11/2064
(Continued)

FOREIGN PATENT DOCUMENTS

EP       1245429      10/2002
EP       3064987       9/2016
(Continued)

OTHER PUBLICATIONS

EP Extended European Search Report in European Appln. No. 20184497.4, dated Dec. 8, 2020, 16 pages.
(Continued)

*Primary Examiner* — Xanthia C Cunningham
(74) *Attorney, Agent, or Firm* — Fish & Richardson P.C.

(57) ABSTRACT

A display device includes a first frame configured to be coupled to a dashboard of a vehicle, a first roller coupled to the first frame and configured to rotate about a first rotary shaft, a second roller located above the first roller, coupled to the first frame, and configured to rotate about a second rotary shaft that extends parallel to the first rotary shaft, a driving track disposed around the first roller and the second roller, a second frame coupled to the driving track and configured to reciprocate upward and downward relative to the first frame, a flexible display coupled to the second frame and to the driving track and configured to receive power
(Continued)

from the vehicle, and an actuator configured to receive power from the vehicle and to move the second frame upward and downward relative to the first frame.

20 Claims, 29 Drawing Sheets

(51) Int. Cl.
*H02K 7/06* (2006.01)
*H02K 7/116* (2006.01)
*H02K 11/215* (2016.01)
*G06F 3/041* (2006.01)
*B60K 35/00* (2006.01)
*F16H 19/04* (2006.01)
*F16H 19/06* (2006.01)
*H05K 5/02* (2006.01)

(52) U.S. Cl.
CPC ............... *G06F 3/041* (2013.01); *H02K 7/06* (2013.01); *H02K 7/116* (2013.01); *H02K 11/215* (2016.01); *H05K 5/0217* (2013.01); *B60K 2370/143* (2019.05); *B60K 2370/152* (2019.05); *B60K 2370/67* (2019.05); *B60K 2370/688* (2019.05); *B60K 2370/816* (2019.05); *G06F 2203/04102* (2013.01); *G06F 2203/04108* (2013.01)

(56) References Cited

U.S. PATENT DOCUMENTS

| 10,328,865 | B2 * | 6/2019 | Jung ..................... B60K 37/04 |
| 10,416,459 | B2 * | 9/2019 | Tatekawa ........... G02B 27/0101 |
| 2013/0058063 | A1 | 3/2013 | O'Brien |
| 2017/0217290 | A1 * | 8/2017 | Yoshizumi ............. B60J 3/0204 |
| 2017/0349098 | A1 * | 12/2017 | Uhm ..................... B60K 35/00 |

FOREIGN PATENT DOCUMENTS

| JP | 2008283350 | 11/2008 |
| KR | 101107127 | 1/2012 |
| KR | 101404805 | 5/2014 |
| KR | 101523171 | 5/2015 |
| KR | 101640053 | 7/2016 |
| KR | 1020160150253 | 12/2016 |
| KR | 1020170027163 | 3/2017 |
| KR | 1020190115888 | 10/2019 |

OTHER PUBLICATIONS

KR Office Action in Korean Appln. No. 10-2020-0002706, dated Jun. 14, 2021, 24 pages (with English translation).

* cited by examiner

DISPLAY APPARATUS FOR VEHICLE

CROSS-REFERENCE TO RELATED APPLICATION

This present application claims the benefit of priority to Korean Patent Application No. 10-2020-0002706, entitled "DISPLAY APPARATUS FOR VEHICLE," filed on Jan. 8, 2020, the entire disclosure of which is incorporated herein by reference.

TECHNICAL FIELD

The present disclosure relates to a vehicle display device, and more particularly to a vehicle display device that is mounted to a dashboard of a vehicle.

BACKGROUND

Vehicles may include various types of display devices capable of displaying images and visual information.

In some examples, a display device may be mounted to a dashboard of a vehicle disposed in front of a driver seat and a front passenger seat. For example, vehicle display devices may include a display device for a navigation system, a head-up display device, and the like.

In some cases, where the size of a display installed in a vehicle is relatively large, there is an advantage of providing a relatively large number and variety of pieces of information to the driver and the passenger through the display. However, the display device may interfere with other devices installed in the vehicle and block the field of vision of the driver and the passenger.

In some cases, where the display has a relatively large size, the amount of power consumption may increase.

SUMMARY

The present disclosure describes a vehicle display device having a structure capable of minimizing the size (area) of a space occupied by the device while also increasing the size (area) of the space occupied by the device.

The present disclosure also describes a vehicle display device in which the size (area) of the surface of a flexible display may change so as to increase and decrease, and tension may be uniformly applied to the flexible display during the change in the size of the flexible display.

The present disclosure further describes a vehicle display device capable of minimizing interference with other components mounted to a dashboard of a vehicle when the vehicle display device is mounted to the dashboard, and avoiding blocking of the field of vision of an occupant of a vehicle.

The present disclosure further describes a vehicle display device capable of operating stably when a flexible display changes in shape.

The present disclosure further describes a vehicle display device in which a portion of a flexible display that maintains its shape, and a transformable portion of the flexible display may be stably supported and disposed in the same planar surface or the same curved surface as each other.

The present disclosure further describes a vehicle display device configured such that even when a flexible display changes in shape, touch input to the flexible display is possible, and the flexible display is capable of functioning as a speaker.

According to one aspect of the subject matter described in this application, a display device for a vehicle includes a first frame configured to be coupled to a dashboard of the vehicle, a first roller coupled to the first frame and configured to rotate about a first rotary shaft, a second roller located vertically above the first roller and coupled to the first frame, where the second roller is configured to rotate about a second rotary shaft that extends parallel to the first rotary shaft, a driving track disposed around the first roller and the second roller, where at least a portion of the driving track is configured to bend, a second frame coupled to the driving track and configured to reciprocate upward and downward relative to the first frame, a flexible display having a first portion coupled to the second frame and a second portion coupled to the driving track, where the flexible display is configured to receive power from the vehicle, and an actuator configured to receive power from the vehicle and to move the second frame upward and downward relative to the first frame.

Implementations according to this aspect may include one or more of the following features. For example, a lower portion of the first frame may be configured to be coupled to a portion of the dashboard, and an upper end of the first frame and an upper end of the second frame are, based the first frame being coupled to the dashboard, located at a higher position than the portion of the dashboard. In some examples, the lower portion of the first frame may be configured to be rotatably coupled to the dashboard.

In some implementations, a rear surface of the first frame may be configured to be coupled to a portion of the dashboard, and the second frame may be configured to, based on the first frame being coupled to the dashboard, move relative to the first frame between (i) a first state in which an upper end of the second frame is located vertically below the portion of the dashboard and (ii) a second state in which the upper end of the second frame is located vertically above the portion of the dashboard.

In some implementations, the flexible display may include a first area that overlaps with a first surface of the second frame facing a rear side of the vehicle, and a second area that extends from the first area and overlaps with an outer surface of the driving track, where the display device may be configured to, based on movement of the second frame relative to the first frame, change a size of exposed portions of the first area and the second area that face the rear side of the vehicle.

In some implementations, the second frame may include a first gear disposed at a second surface of the second frame that faces a front side of the vehicle, where the first gear has teeth arranged along an upward-downward direction. The actuator may include a driving gear engaged with the first gear, and a driving motor coupled to the first frame and configured to rotate the driving gear.

In some implementations, the driving track may include a first coupling disposed at a first end of the driving track and coupled to a lower end of the second frame, and a second coupling disposed at a second end of the driving track and coupled to the second frame, where the second coupling may be disposed vertically above the first coupling.

In some implementations, the driving track may include a first coupling disposed at a first end of the driving track and coupled to a lower end of the second frame, and a second coupling disposed at a second end of the driving track and coupled to the lower end of the second frame.

In some implementations, the driving track may include a chain that is coupled to a lower end of the second frame and includes a plurality of links connected to one another and configured to rotate about respective rotary shafts parallel to the first rotary shaft, and a guide plate that includes an elastic metal plate and has a first end portion connected to the chain and a second end portion coupled to the second frame.

In some examples, the chain may include a first link that defines a first link hole, a second link that defines a second link hole, and a link pin that is inserted into the first link hole and the second link hole and connects the first link to the second link. The first link hole may have an elongated shape having a first diameter in a thickness direction of the chain and a second diameter in a longitudinal direction of the chain, where the second diameter is greater than the first diameter. In some examples, the guide plate may define a plurality of first through-holes formed to be elongated in a direction parallel to the first rotary shaft.

In some implementations, the display device may include a backplate coupled to a rear surface of the flexible display, where the backplate may include an elastic metal plate. The backplate may include a fixed area configured to overlap with the second frame and a transformable area configured to overlap with the driving track, where the transformable area defines a plurality of through-holes formed to be elongated in a direction parallel to the first rotary shaft. In some examples, the display device may further include a plurality of first magnets coupled to the first frame, where the transformable area has a front portion located forward relative to the first magnets and a rear portion located rearward relative to the first magnets. A distance between the first magnets and the front portion of the transformable area may be less than a distance between the first magnets and the rear portion of the transformable area.

In some implementations, the first roller and the second roller may be configured to move away from each other, where the display device may include an elastic body configured to elastically support one of the first roller or the second roller in a direction away from another of the first roller or the second roller.

In some implementations, the flexible display may include a first area that overlaps with a first surface of the second frame facing a rear side of the vehicle, and a second area that extends from the first area and overlaps with an outer surface of the driving track. The second area may include a separated portion that extends from the first area and is spaced apart from the outer surface of the driving track, and a coupled portion that extends from the separated portion and is coupled to the outer surface of the driving track.

In some implementations, the flexible display may include a first area that overlaps with the second frame, and a second area that overlaps with the driving track, where the display device may include a plurality of support bars that are coupled to a rear surface of the second area and extend in a direction parallel to the first rotary shaft. In some implementations, the display device may include a touch sensor that overlaps with the first area. In some implementations, the display device may include an exciter that is disposed on a rear surface of the first area and configured to generate a vibration of the flexible display.

According to another aspect, a display device for a vehicle includes a first frame configured to be coupled to a dashboard of the vehicle, a first roller coupled to the first frame and configured to rotate about a first rotary shaft, a second roller located vertically above the first roller and coupled to the first frame, where the second roller is configured to rotate about a second rotary shaft parallel to the first rotary shaft, a driving track disposed around the first roller and the second roller, where the driving track is configured to bend, a second frame coupled to the driving track and configured to reciprocate in an upward-downward direction relative to the first frame, where the second frame includes a first gear having teeth arranged in the upward-downward direction, a flexible display having a first portion coupled to the second frame and a second portion coupled to the driving track, where the flexible display is configured to receive power from the vehicle, a driving gear coupled to the first frame and configured to rotate about a third rotary shaft parallel to the first rotary shaft, where the driving gear is engaged with the first gear, and a driving motor configured to receive power from the vehicle and to rotate the driving gear.

Implementations according to this aspect may include one or more of the following features, or one or more of the features described above. For example, the second frame may be configured to move relative to the first frame between a first position and a second position vertically above the first position. The display device further may include a magnet coupled to the driving track, a first Hall sensor configured to sense the magnet based on the second frame being at the first position, and a second Hall sensor configured to sense the magnet based on the second frame being at the second position, where a rotating speed of the driving motor may be controlled according to a signal from the first Hall sensor or the second Hall sensor.

In some implementations, the vehicle display device may change between a first state and a second state. The overall size of the device may be reduced in the first state, and the area of the display that is exposed to an occupant may be increased in the second state. When the vehicle display device changes between the first state and the second state, the area of the flexible display, which is oriented in one direction, may be increased or decreased. A driving track, coupled to a second frame, may be formed as a continuous track, and tension may thus be applied uniformly to the flexible display. That is, it may be possible to minimize the difference between the tension applied to the flexible display during the change from the first state to the second state and the tension applied to the flexible display during the change from the second state to the first state.

In some implementations, when the vehicle display device changes between the first state and the second state, a part of the vehicle display device may not enter the dashboard, thereby avoiding interference with other components mounted in the dashboard.

In some implementations, the flexible display and an actuator may receive power from the vehicle. Accordingly, in some examples, the vehicle display device may not include a separate battery. The flexible display and the actuator may receive power through wires disposed in the space defined by a first area and a second area of the flexible display, thereby preventing or reducing an increase in the thickness of the vehicle display device due to wiring.

In some implementations, at least a portion of the flexible display may be maintained in the state of being exposed to the outside, and the height of the upper end of the flexible display from the dashboard may be adjusted. Accordingly, it may be possible to effectively implement display of an image through the flexible display and adjust the size of the screen of the display without blocking the field of vision of an occupant.

In some implementations, a portion of the flexible display may maintain its shape, and a transformable portion of the flexible display may be stably supported and lie in the same planar surface or the same curved surface as each other.

In some implementations, an exciter and a touch sensor may be disposed at a position corresponding to the first area of the flexible display. Accordingly, even when the flexible display changes in shape, touch input to the flexible display may be possible, and the flexible display may function as a speaker.

In some implementations, an image may be displayed only in the first area of the flexible display in the first state, thereby reducing power consumption.

BRIEF DESCRIPTION OF THE DRAWINGS

The above and other aspects, features, and advantages of the present disclosure will become apparent from the detailed description of the following aspects in conjunction with the accompanying drawings.

FIG. 2A illustrates an example of a first state, and FIG. 2B illustrates an example of a second state.

FIGS. 3A and 3B illustrate an example of a first frame using a dotted line.

FIG. 4 is a cross-sectional view taken along line A-A' in FIG. 3A.

FIGS. 5A and 5B are cross-sectional views taken along line A-A' in FIG. 3A.

FIG. 6 is a cross-sectional view taken along line A-A' in FIG. 3A.

FIG. 7A illustrates an example of a first state, and FIG. 7B illustrates an example of a second state. FIG. 7A is a cross-sectional view taken along line B-B' in FIG. 3A, and FIG. 7B is a cross-sectional view taken along line D-D' in FIG. 3B.

FIG. 15A is a view taken along line A-A' in FIG. 3A and illustrates an example of a first state, and FIG. 15B is a view taken along line C-C' in FIG. 3B and illustrates an example of a second state.

FIG. 19A illustrates an example of a first state, and FIG. 19B illustrates an example of a second state.

DETAILED DESCRIPTION

Figure 1:
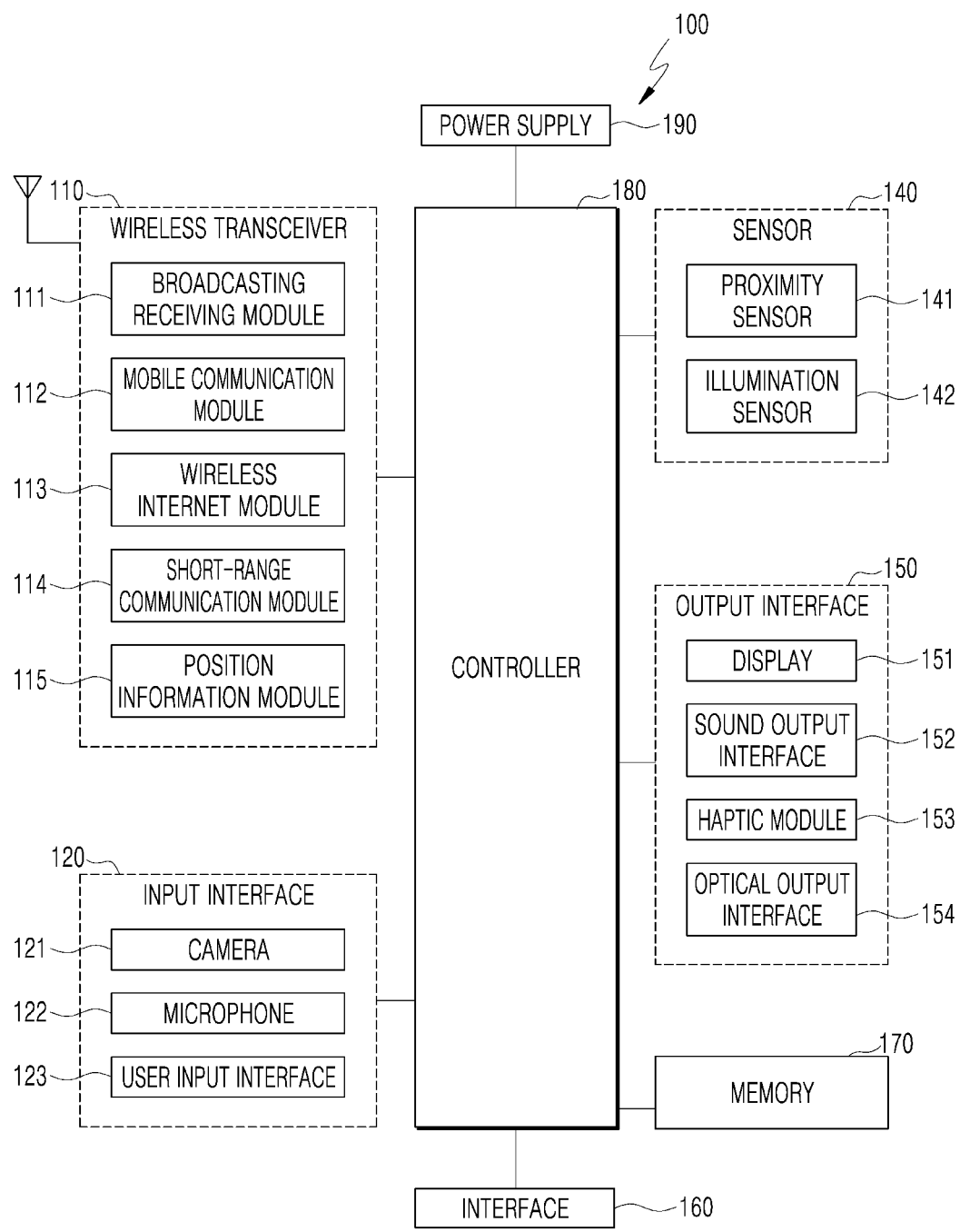
FIG. 1 is a block diagram showing example components of an example of a vehicle display device.

Hereinafter, one or more implementations of the present disclosure will be described in detail with reference to accompanying drawings, and the same or similar elements are designated with the same numeral references regardless of numerals in the drawings and their redundant description will be omitted. The accompanying drawings are merely used to help easily understand implementations of the present disclosure, and it should be understood that the technical idea of the present disclosure is not limited by the accompanying drawings, and these implementations include some changes, equivalents or alternatives within the idea and the technical scope of the present disclosure.

FIG. 1 is a block diagram showing an example of a vehicle display device 100.

In some implementations, the vehicle display device 100 may include a wireless transceiver 110, an input interface 120, a sensor 140, an output interface 150, an interface 160, a memory 170, a controller 180, and a power supply 190. In some examples, the vehicle display device described in the present disclosure may include more or fewer components than the components illustrated in FIG. 1.

In some implementations, the wireless transceiver 110 may include one or more modules which enable wireless communication between the vehicle display device 100 and a wireless communication system, between the vehicle display device 100 and another vehicle display device 100, or between the vehicle display device 100 and an external server. Further, the wireless transceiver 110 may include one or more modules which connect the vehicle display device 100 to one or more networks.

The wireless transceiver 110 may include at least one of a broadcasting receiving module 111, a mobile communication module 112, a wireless internet module 113, a short-range communication module 114, or a position information module 115.

The input interface 120 may include a camera 121 or an image input interface which receives input of an image signal, a microphone 122 or an audio input interface which receives input of an audio signal, and a user input interface 123 (for example, a touch key or a mechanical key) which receives information from a user. Voice data or image data collected by the input interface 120 is analyzed and processed as a control command of the user.

The sensor 140 may include one or more sensors configured to sense at least one of information in the vehicle display device, surrounding environment information around the vehicle display device, or user information. For example, the sensor 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, a camera 121 or a microphone 122), a battery gauge, an environment sensor (for example, a barometer, a hygrometer, a thermometer, a radiation sensor, a thermal sensor, and a gas sensor), or a chemical sensor (for example, an electronic nose, a healthcare sensor, and a biometric sensor). Further, the display device disclosed in the present specification may combine and utilize information sensed by at least two sensors from the above-mentioned sensors.

The output interface 150 generates outputs related to visual, auditory, or tactile senses, and may include at least one of a display 151, a sound output interface 152, a haptic module 153, or an optical output interface 154. The display 151 may be configured as a touch screen by forming a mutual layered structure with a touch sensor or being formed integrally therewith. The touch screen may simultaneously serve as a user input interface 123 for providing an input interface between the vehicle display device 100 and the user and an output interface between the vehicle display device 100 and the user.

The interface 160 serves as a passage between various types of external devices which are connected to the vehicle display device 100. The interface 160 may include at least one of a wired/wireless headset port, an external charger port, a wired/wireless data port, a memory card port, a port which connects a device equipped with an identification module, an audio input/output (I/O) port, a video input/output (I/O) port, or an earphone port. The vehicle display device 100 may perform appropriate control related to the connected external device in accordance with the connection of the external device to the I/O connector or interface 160.

Further, the memory 170 may store data which supports various functions of the vehicle display device 100. The memory 170 may store a plurality of application programs or applications that are driven by the vehicle display device 100, data for operating the vehicle display device 100, and instructions. At least some of the application programs may be downloaded via an external server through wireless communication. Further, at least some of the application programs, related to basic functions of the vehicle display device 100 (for example, incoming and outgoing call functions, and message receiving and sending functions), may be installed in the vehicle display device 100 from the time of release. The application programs are stored in the memory 170, and are installed in the vehicle display device 100 and driven by the controller 180 to perform operations (or functions) of the vehicle display device.

In addition to the operations related to the application programs, the controller 180 may generally control the overall operation of the vehicle display device 100. The controller 180 may process signals, data, or information which is inputted or outputted through the above-described components, or drive the application programs stored in the memory 170 to provide or process appropriate information or functions to the user.

Further, in order to drive the application program stored in the memory 170, the controller 180 may control at least some of components described with reference to FIG. 1. Moreover, the controller 180 may combine and operate at least two of the components included in the vehicle display device 100 to drive the application program. For example, the controller 180 may include one or more processors, a computer, an electric circuit, a microprocessor, or the like.

The power supply 190 receives application of external power, and supplies the power to the respective components included in the vehicle display device 100 under the control of the controller 180.

At least some of the above-described components may operate in cooperation with each other to implement the operation, the control, or the control method of the vehicle display device according to various implementations, which will be described below. Further, the operation, the control, or the control method of the vehicle display device may be implemented in the vehicle display device by driving at least one application program stored in the memory 170.

Hereinafter, prior to describing various examples of the vehicle display device 100 described above, the above-mentioned components will be described in more detail with reference to FIG. 1.

In some examples, the wireless transceiver 110 may include a broadcasting receiving module 111 that receives a broadcasting signal and/or broadcasting-related information from an external broadcasting management server through a broadcasting channel. The broadcasting channel may include a satellite channel and a ground wave channel. Two or more broadcasting receiving modules for simultaneous broadcasting reception or broadcasting channel switching for at least two broadcasting channels may be provided in the vehicle display device 100.

The broadcasting management server may refer to a server which generates and transmits a broadcasting signal and/or broadcasting-related information, or a server which is supplied with a previously generated broadcasting signal and/or broadcasting-related information and transmits the broadcasting signal and/or the broadcasting-related information to the vehicle display device. The broadcasting signal includes not only a TV broadcasting signal, a radio broadcasting signal, and a data broadcasting signal, but also a broadcasting signal obtained by combining a TV broadcasting signal or a radio broadcasting signal with a data broadcasting signal.

The broadcasting signal may be encoded according to at least one technical standard for transmitting and receiving a digital broadcasting signal (or broadcasting schemes, for example, ISO, IEC, DVB, or ATSC), and the broadcasting receiving module 111 may receive the digital broadcasting signal using an appropriate method for the technical specification determined by the technical standard.

The broadcasting-related information may refer to information related to a broadcasting channel, a broadcasting program, or a broadcasting service provider. The broadcasting-related information may also be provided through the mobile communication network. In this case, the broadcasting-related information may be received by the mobile communication module 112.

The broadcasting-related information may exist in various types such as an electronic program guide of digital multimedia broadcasting (DMB) or an electronic service guide of a digital video broadcast-handheld (DVB-H). The broadcasting signal and/or the broadcasting-related information received by the broadcasting receiving module 111 may be stored in the memory 170.

The mobile communication module 112 may include a modem that may transmit/receive a wireless signal to/from at least one among a base station, an external terminal, or a server on a mobile communication network established according to the technical standards or communication methods for mobile communication (for example, Global System for Mobile communication (GSM), Code Division Multi Access (CDMA), Code Division Multi Access 2000

(CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)).

The wireless signal may include a voice call signal, a video call signal, or various types of data in accordance with transmission or reception of a text/multimedia message.

The wireless Internet module 113 refers to a module for wireless Internet access and may be built in or external to the vehicle display device 100. The wireless Internet module 113 may be configured to transmit/receive a wireless signal in a communication network according to wireless Internet technologies.

Wireless Internet technologies may include wireless LAN (WLAN), wireless fidelity (Wi-Fi), Wi-Fi direct, Digital Living Network Alliance (DLNA), wireless broadband (Wi-Bro), Worldwide Interoperability for Microwave Access (WiMAX), High Speed Downlink Packet Access (HSDPA), High Speed Uplink Packet Access (HSUPA), Long Term Evolution (LTE), and Long Term Evolution-Advanced (LTE-A). The wireless Internet module 113 may transmit or receive data in accordance with at least one of the wireless Internet technologies or other types of Internet technologies.

From the viewpoint that the wireless Internet connection by WiBro, HSDPA, HSUPA, GSM, CDMA, WCDMA, LTE, LTE-A, etc. is performed through a mobile communication network, the wireless Internet module 113 which performs the wireless Internet connection through the mobile communication network may be understood as a type of the mobile communication module 112.

The short-range communication module 114 may support short-range communication using at least one of Bluetooth™, infrared data association (IrDA), ultra wideband (UWB), ZigBee, Short-range Communication (NFC), wireless fidelity (Wi-Fi), Wi-Fi Direct, or Wireless Universal Serial Bus (Wireless USB). The short-range communication module 114 may support wireless communication between the vehicle display device 100 and the wireless communication system, between the vehicle display device 100 and another vehicle display device 100, or between the vehicle display device 100 and a network in which the other vehicle display device 100 (or external server) is located, through a short-range wireless communication network. The short-range wireless communication network may be a short-range wireless personal communication network.

The position information module 115 may include a Global Navigation Satellite System (GNSS) sensor that is configured to obtain the location (or the current location) of a vehicle display device, and its representative examples include a global positioning system (GPS) module or a Wi-Fi module. For example, when a GPS module is utilized, the vehicle display device may obtain the position of the vehicle display device using a signal transmitted from a GPS satellite. As another example, when a Wi-Fi module is utilized, the vehicle display device may obtain the position of the vehicle display device based on information of a wireless access point (AP) which transmits and receives wireless signals with the Wi-Fi module. In some cases, the position information module 115 may perform a function of another module of the wireless transceiver 110 to alternatively or additionally obtain data on the position of the vehicle display device. As a module used to obtain a position (or a current position) of the vehicle display device, the position information module 115 is not limited to a module which directly calculates or obtains the position of the vehicle display device.

In some implementations, the input interface 120 is provided to input video information (or signals), audio information (or signals), data, or information inputted from the user. In order to receive input of video information, the vehicle display device 100 may include one or more cameras 121. The camera 121 processes an image frame such as a still image or a moving image obtained by an image sensor in a video call mode or a photographing mode. The processed image frames may be displayed on the display 151 or stored in the memory 170. Further, the plurality of cameras 121 equipped in the vehicle display device 100 may be disposed to form a matrix structure, and a plurality of pieces of image information having various angles or focal points may be inputted to the vehicle display device 100 through the cameras 121 that form the matrix structure. Further, the cameras 121 may be disposed to have a stereo structure to obtain a left image and a right image to implement a stereoscopic image.

The microphone 122 processes an external sound signal as electronic voice data. The processed voice data may be utilized in various forms in accordance with a function being performed by the vehicle display device 100 (or an application program which is being executed). In the microphone 122, various noise removal algorithms which remove noise generated during the process of receiving the external sound signal may be implemented.

The user input interface 123 receives information from the user, and when the information is inputted through the user input interface 123, the controller 180 may control the operation of the vehicle display device 100 so as to correspond to the inputted information. The user input interface 123 may include a mechanical input interface (or a mechanical key, for example, a button located on a front, rear, or side surface of the vehicle display device 100, a dome switch, a jog wheel, a jog switch, or the like) and a touch type input interface. As one example, the touch type input interface may include a virtual key, a soft key, or a visual key displayed on the touch screen via a software process, or may include a touch key disposed on a portion other than the touch screen. The virtual key or the visual key may be displayed on the touch screen in various shapes, and for example, may be formed by graphics, text, icons, video, or a combination thereof.

The sensor 140 senses at least one of information in the vehicle display device, surrounding environment information around the vehicle display device, or user information, and generates a sensing signal corresponding to the information. The controller 180 may control the driving or the operation of the vehicle display device 100 or perform data processing, functions, or operations related to the application programs installed in the vehicle display device 100, based on the sensing signal. Representative sensors among the various sensors which may be included in the sensor 140 will be described in more detail below.

In some examples, the proximity sensor 141 may sense the presence of an object approaching a predetermined sensing surface or nearby objects, using an electromagnetic field force or infrared ray without any mechanical contact. The proximity sensor 141 may be disposed in an internal area of the vehicle display device, which is enclosed by the above-described touch screen, or in the vicinity of the touch screen.

Examples of the proximity sensor 141 may include a transmission type photoelectric sensor, a direct reflection type photoelectric sensor, a mirror reflection type photoelectric sensor, a high frequency oscillation type proximity sensor, a capacitive proximity sensor, a magnetic proximity sensor, and an infrared proximity sensor. When the touch screen is a capacitive type, the proximity sensor 141 may be configured to detect the proximity of the object with a change in the electric field in accordance with the proximity of the object having conductivity. In this case, the touch screen (or the touch sensor) itself may be classified as a proximity sensor.

For convenience of description, when an object approaches the touch screen without contacting the touch screen, and it is recognized that the object is located above the touch screen, it is referred to as a "proximity touch". When the object actually touches the touch screen, it is referred to as a "contact touch". A position at which the object proximately touches the touch screen refers to a position at which the object vertically corresponds to the touch screen when the object proximately touches the touch screen. The proximity sensor 141 may sense a proximate touch and a proximate touch pattern (for example, a proximate touch distance, a proximate touch direction, a proximate touch speed, a proximate touch time, a proximate touch position, a proximate touch movement state, etc.). As described above, the controller 180 may process data (or information) corresponding to the proximate touch operation and the proximate touch pattern sensed by the proximity sensor 141, and may further output visual information corresponding to the processed data on the touch screen. Furthermore, the controller 180 may control the vehicle display device 100 to process different operations or data (or information) depending on whether the touch on the same point on the touch screen is a proximity touch or a contact touch.

The touch sensor senses a touch (or a touch input) applied to the touch screen (or the display 151) using at least one of various touch types such as a resistive film type, a capacitive type, an infrared type, an ultrasonic type, and a magnetic field type.

For example, the touch sensor may be configured to convert a change of a pressure which is applied to a specific portion of the touch screen, or a capacitance which is generated in a specific portion, into an electrical input signal. The touch sensor may be configured to detect a position and an area where a touch subject which applies a touch onto the touch screen is touched on the touch sensor, and a capacitance at the time of the touch. Here, the touch subject is an object which applies a touch to the touch sensor, and may include, for example, a finger, a touch pen, a stylus pen, and a pointer.

As described above, when there is a touch input to the touch sensor, corresponding signals are transmitted to a touch controller. The touch controller processes the signal(s) and then transmits corresponding data to the controller 180. By doing this, the controller 180 may confirm which area of the display 151 is touched. Here, the touch controller may be a separate component from the controller 180, or may be the controller 180 itself.

The controller 180 may perform different control or the same control depending on a type of a touch subject which touches the touch screen (or a touch key equipped other than the touch screen). Whether to perform the different control or the same control depending on the type of touch subject may be determined in accordance with an operating state of the vehicle display device 100 or an application program which is being executed.

The touch sensor and proximity sensor described above may, independently or in combination, sense various types of touches on the touch screen, such as a short (or tap) touch, a long touch, a multi touch, a drag touch, a flick touch, a pinch-in touch, a pinch-out touch, a swipe touch, or a hovering touch.

The ultrasonic sensor may recognize position information of a sensing object using an ultrasonic wave. The controller 180 may calculate a position of a wave generating source by information sensed by the optical sensor and the plurality of ultrasonic sensors. A position of the wave generating source may be calculated using the property that light is much faster than an ultrasonic wave, that is, the time in which light reaches the optical sensor is much faster than the time in which the ultrasonic wave reaches the ultrasonic sensor. More specifically, the position of the wave generating source may be calculated using a time difference of the time of arrival of the ultrasonic wave with respect to light which serves as a reference signal.

As seen from the configuration of the input interface 120, the camera 121 includes at least one of a camera sensor (for example, a CCD or a CMOS), a photo sensor (or an image sensor), or a laser sensor.

The camera 121 and the laser sensor may be combined to sense a touch of a sensing object for a three-dimensional stereoscopic image. The photo sensor, which is laminated on a display element, is configured to scan a motion of a sensing object proximate to the touch screen. More specifically, the photo sensor is formed by mounting photo diodes and transistors (TR) in rows/columns to scan contents which are disposed on the photo sensor using an electrical signal that changes in accordance with an amount of light applied to the photo diode. That is, the photo sensor calculates coordinates of a sensing object in accordance with a changed amount of light, and position information of the sensing object may be obtained through the coordinates.

The display 151 displays (outputs) information processed in the vehicle display device 100. For example, the display 151 may display execution screen information of an application program driven in the vehicle display device 100 and user interface (UI) and graphic user interface (GUI) information in accordance with the execution screen information.

Further, the display 151 may be configured as a stereoscopic display which displays a stereoscopic image.

A three-dimensional display type such as a stereoscopic type (a glass type), an autostereoscopic type (a glass-free type), a projection type (a holographic type) may be applied to the stereoscopic display.

The sound output interface 152 may include a speaker that is configured to output audio data received from the wireless transceiver 110 or stored in the memory 170 in a call signal reception mode, a phone-call mode, a recording mode, a speech recognition mode, or a broadcasting reception mode. The sound output interface 152 may also output a sound signal related to a function (for example, a call signal reception sound or a message reception sound) performed in the vehicle display device 100. Such a sound output interface 152 may include, for example, a receiver, a speaker, and a buzzer.

The haptic module 153 may generate various tactile effects that can be felt by the user. A representative example of the tactile effect generated by the haptic module 153 may be vibration. For instance, the haptic module 153 may include an actuator configured to generate vibration. An intensity and a pattern of the vibration generated in the haptic module 153 may be controlled by the selection of the user or a setting of the controller 180. For example, the haptic module 153 may compose different vibrations to output the composed vibrations, or sequentially output the different vibrations.

In addition to vibration, the haptic module 153 generates various tactile effects such as effects by a pin arrangement which vertically moves to a contact skin surface, an injection force or a suction force of air through an injection port or a suction port, grazing on a skin surface, electrode contact, or stimulation of an electrostatic force or effects of reproducing a cold or hot sensation using a heat absorbing or heat emitting element.

The haptic module 153 may not only transmit a tactile effect by means of direct contact, but may also be implemented to allow the user to feel a tactile effect by muscular sensation of a finger or an arm. Two or more haptic modules 153 may be provided in accordance with a configuration aspect of the vehicle display device 100.

The optical output interface 154 outputs a signal for notifying occurrence of an event using light of a light source of the vehicle display device 100. Examples of events generated in the vehicle display device 100 may be message reception, call signal reception, missed call, alarm, schedule notification, email reception, and information reception through an application.

The signal outputted from the optical output interface 154 is implemented as the vehicle display device emits single color or a plurality of color light to a front surface or a rear surface. When the vehicle display device senses the event confirmation of the user, the signal output may be completed.

The interface 160 serves as a passage with all or some of external devices which are connected to the vehicle display device 100. The interface 160 receives data from the external device or is supplied with the power source to transmit the power source to each component in the vehicle display device 100, or transmits data in the vehicle display device 100 to the external device. For example, the interface 160 may include a wired/wireless headset port, an external charger port, a wired/wireless data port, a memory card port, a port which connects a device equipped with an identification module, an audio input/output (I/O) port, a video input/output (I/O) port, an earphone port, etc.

The identification module is a chip in which various information for authenticating a usage right of the vehicle display device 100 is stored and includes a user identification module (UIM), a subscriber identification module (SIM), and a universal subscriber identity module (USIM). A device with an identification module (hereinafter, "identification device") may be manufactured as a smart card. Therefore, the identification device may be connected to the display device 100 through the I/O connector or interface 160.

The memory 170 may store a program for an operation of the controller 180, or temporarily store input/output data (for example, a phone book, a message, a still image, a moving image, etc.). The memory 170 may store data on a vibration or a sound of various patterns output when the touch is inputted onto the touch screen.

The memory 170 may include at least one type of non-transitory storage medium of a flash memory type, a hard disk type, a solid state disk (SSD) type, a silicon disk drive (SDD) type, a multimedia card micro type, and card type memories (for example, SD or XD memory and the like), a random access memory (RAM), a static random access memory (SRAM), a read only memory (ROM), an electrically erasable programmable read only memory (EEPROM), a programmable read only memory (PROM), a magnetic memory, a magnetic disk, and an optical disk. The vehicle display device 100 may operate in association with a web storage which performs a storage function of the memory 170 on the Internet.

As described above, the controller 180 may control an operation related to the application program and an overall operation of the vehicle display device 100. For example, when the state of the vehicle display device satisfies a predetermined condition, the controller 180 may execute or release a locking state which restricts an input of a control command of a user for the applications.

Further, the controller 180 may perform control and processing related to voice call, data communication, and video call, or perform a pattern recognition process which recognizes a handwriting input or a picture drawing input performed on the touch screen as a text or an image, respectively. Moreover, the controller 180 may control any one or a combination of a plurality of components described above to implement various examples which will be described below on the vehicle display device 100.

The display 151 displays (outputs) information processed in the vehicle display device 100. For example, the display 151 may display execution screen information of an application program driven in the vehicle display device 100 and user interface (UI) and graphic user interface (GUI) information in accordance with the execution screen information.

The display 151 may include at least one of a liquid crystal display (LCD), a thin film transistor liquid crystal display (TFT LCD), an organic light emitting diode (OLED), a three-dimensional display (3D display), an electronic ink display (e-ink display), or other types of flexible displays.

Further, two or more displays 151 may be provided in accordance with an implementation type of the vehicle display device 100. In this case, a plurality of displays may be disposed to be spaced apart from each other or integrally disposed on one surface of the vehicle display device 100 or may be disposed on different surfaces.

The display 151 may include a touch sensor which senses a touch on the display 151 so as to receive the control command by the touch method. Therefore, when the touch is made on the display 151, the touch sensor senses the touch, and based on the touch the controller 180 generates a control command corresponding to the touch. Contents inputted by the touch method may be letters or numbers, instructions in various modes, menu items which may be designated, or the like.

The microphone 122 is configured to receive a voice of the user, or other sounds. The microphone 122 is equipped in a plurality of locations to receive stereo sounds.

The interface 160 serves as a passage through which the vehicle display device 100 is connected to the external device. For example, the interface 160 may be at least one of a connection terminal for connection with other devices (for example, an earphone or an external speaker), a port for short-range communication (for example, an infrared port (IrDA port), a Bluetooth port, a wireless LAN port, etc.), or a power supply terminal for supplying a power to the vehicle display device 100. The interface 160 may be implemented as a socket type which accommodates an external card such as a subscriber identification module (SIM), a user identity module (UIM), and a memory card for information storage.

At least one antenna for wireless communication may be provided in a terminal body. The antenna may be embedded in the terminal body or formed in a case. For example, the antenna which forms a part of the broadcasting receiving module 111 (see FIG. 1) may be configured to be drawn from the terminal body. Alternatively, the antenna may be formed as a film type to be attached onto an inner surface of a housing, or a case including a conductive material may serve as an antenna.

Figure 2A:
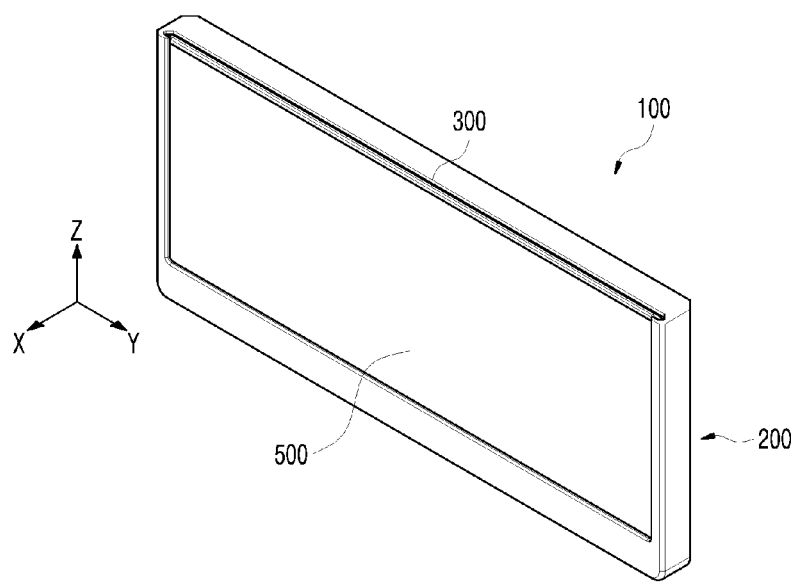
FIGS. 2A and 2B are perspective views showing an example of a vehicle display device, where
Figure 2B:
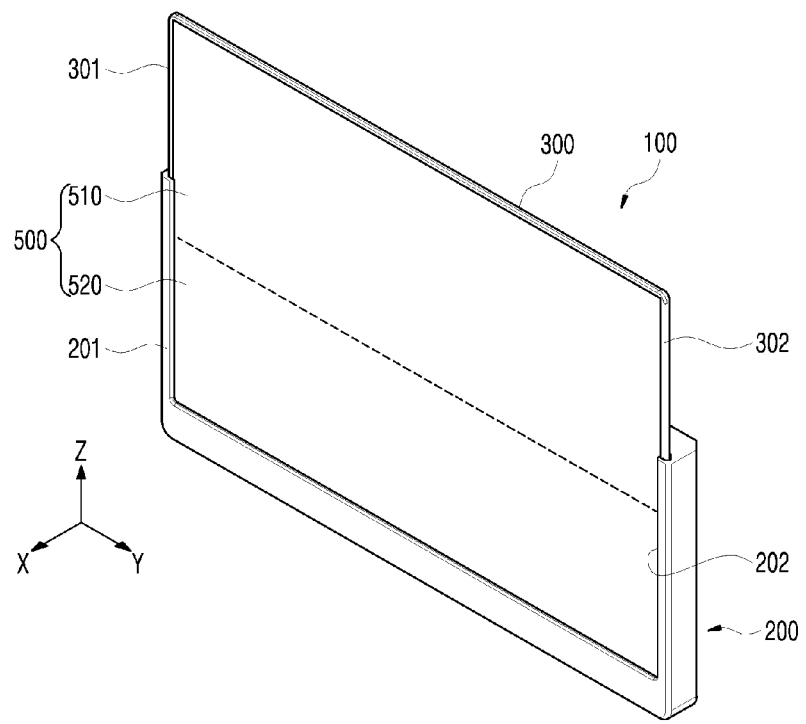

FIGS. 2A and 2B are perspective views showing an example of a vehicle display device 100. FIG. 2A illustrates an example of a first state, and FIG. 2B illustrates an example of a second state.

Figure 3A:
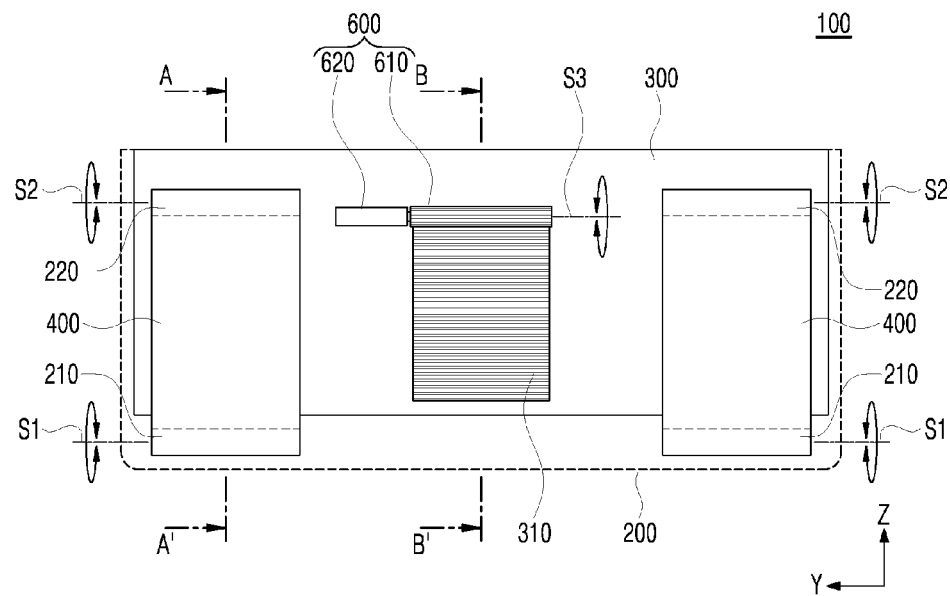
FIG. 3A is a view schematically showing example components of the vehicle display device shown in FIG. 2A when viewed from a rear side of the display device.
Figure 3B:
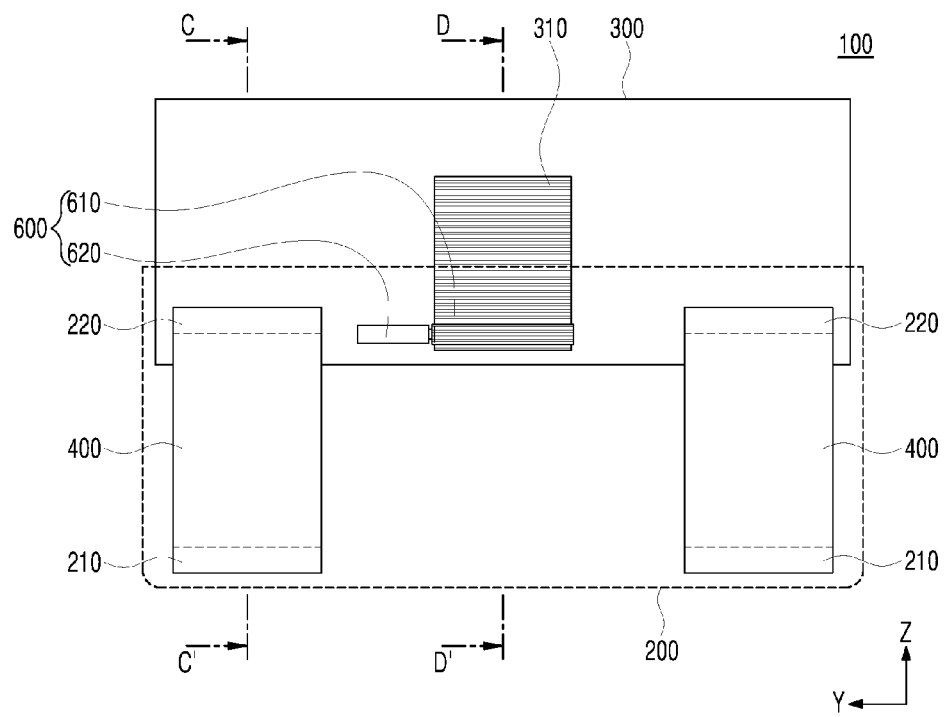
FIG. 3B is a view schematically showing example components of the vehicle display device shown in FIG. 2B when viewed from the rear side, where

FIG. 3A is a view schematically showing example components of the vehicle display device 100 shown in FIG. 2A when viewed from the rear side of the display device 100, and FIG. 3B is a view schematically showing example components of the vehicle display device 100 shown in FIG. 2B when viewed from the rear. In FIGS. 3A and 3B, a first frame 200 is illustrated using a dotted line.

In the present disclosure, an X-axis direction, a Y-axis direction, and a Z-axis direction shown in the drawings may be perpendicular to one another. For example, the Z-axis may extend in a vertical or upward-downward direction of a vehicle, the X-axis may extend in a front-rear direction of the vehicle, and the Y-axis may extend in a left-right direction of the vehicle.

The inside refers to a relative inside of the vehicle display device 100, and the outside refers to a relative outside of the vehicle display device 100.

The vehicle display device 100 may include a first frame 200, a second frame 300, and a flexible display 500.

The flexible display 500 may be configured to be transformed by external force.

For example, the transformation may include at least one of warping, bending, folding, twisting, rolling, and spreading of the display module. The transformable display module may be referred to as a "flexible display". Here, the flexible display 500 may include various types of flexible displays, an electronic paper (e-paper), or any combination thereof.

For example, flexible displays may be a durable display which maintains characteristics of existing flat panel displays, and is manufactured on a thin and flexible substrate which can be warped, bent, folded, twisted, rolled, and spread like paper, is light in weight, and is not easily broken.

Further, electronic paper is a display technique to which characteristics of general ink are applied, but uses reflection light, which is different from existing flat panel displays. The electronic paper may change information using a twist ball or electrophoresis using a capsule.

Information displayed on the flexible display 500 may include visual information that is outputted on a curved surface. The visual information is implemented by independently controlling the light emission of unit pixels (sub pixels) disposed in a matrix. A unit pixel refers to a minimum unit which implements one color.

A part of the flexible display 500 may be not flat but may be bent. In this case, when an external force is applied to the flexible display 500, a part of the flexible display 500 may be deformed into a flat state, or a less bent state or a more bent state.

The flexible display 500 may be combined with a touch sensor to implement a flexible touch screen. When a touch is made on the flexible touch screen, the controller 180 (see FIG. 1) performs control corresponding to the touch input. The flexible touch screen is formed such that the touch input is sensed while a part of the flexible display 500 is spread or bent.

The vehicle display device 100 according to the modified example may include a deformation sensing means which senses deformation of the flexible display 500. The deformation sensing means may be included in the sensor 140 (see FIG. 1).

The deformation sensing means may be provided in the flexible display 500 or the first frame 200, and may sense information related to the deformation of the flexible display 500. Here, the information related to the deformation may be information on a deformation direction of the flexible display 500, information on how much the flexible display 500 is deformed, information on the position of the deformation, information on the time of the deformation, information on an acceleration at which the deformed flexible display 500 is restored, and the like. In addition to the above information, various other types of information which can be sensed due to the bending of the flexible display 500 may also be included.

Further, the controller 180 (see FIG. 1) may change information disposed on the flexible display 500 or generate a control signal for controlling a function of the vehicle display device 100, based on the information related to the deformation of the flexible display 500 sensed by the deformation sensing means.

The deformation of the state of the flexible display 500 is not limited to the deformation by the external force. For example, when a part of the flexible display 500 is unfolded, the part may be deformed to be bent by the command of the user or an application.

The first frame 200 may form the overall exterior of the vehicle display device 100. The first frame 200 may be formed of a relatively solid material. The first frame 200 may be formed of plastic, metal, or a combination thereof. Other components constituting the vehicle display device 100 may be coupled to the first frame 200.

The first frame 200 may be formed in any of various configurations for supporting other components coupled thereto. For example, as shown in FIGS. 2A and 2B, the first frame 200 may have a rectangular shape overall, and may also have a flat shape overall.

The first frame 200 may be formed to have a flat surface that is perpendicular to the first direction (the X-axis direction). Accordingly, the first frame 200 has a predetermined length in the second direction (the Y-axis direction), which is perpendicular to the first direction, and further has a predetermined length in the third direction (the Z-axis direction), which is perpendicular to the first direction and the second direction.

When the first direction (the X-axis direction) is a direction that is parallel to the forward-backward direction of the vehicle, the second direction (the Y-axis direction) may be a direction that is parallel to the leftward-rightward direction of the vehicle, and the third direction (the Z-axis direction) may be a direction that is parallel to the upward-downward direction of the vehicle.

In the present disclosure, the forward-backward direction and the leftward-rightward direction may be directions that are parallel or substantially parallel to the horizontal direction, and the upward-downward direction may be a direction that is parallel or substantially parallel to the vertical direction.

The second frame 300 may be formed in a plate shape. The second frame 300 may be formed in a rectangular plate shape.

The second frame 300 may include flat surfaces 300*a* and 300*b* that are perpendicular to the first direction (the X-axis direction). The second frame 300 may be coupled to the first frame 200 so as to perform reciprocating movement in the third direction. The second frame 300 may be coupled to the first frame 200 so as to perform sliding movement.

The second frame 300 includes a first surface 300*a* and a second surface 300*b*. The second surface 300*b* is the surface that is opposite the first surface 300*a*.

The first surface 300*a* may be disposed so as to face the interior of the vehicle, and the second surface 300*b* may be disposed so as to face the exterior of the vehicle. That is, the first surface 300*a* may be the surface that faces the driver and the passenger in the vehicle.

The first surface 300*a* may be disposed so as to face the rear side of the vehicle, and the second surface 300*b* may be disposed so as to face the front side of the vehicle. That is, the direction perpendicular to the first surface 300*a* and the second surface 300*b* may substantially be the forward-backward direction of the vehicle.

When the second frame 300 reciprocates in the third direction with respect to the first frame 200, the second frame 300 may move within a range of the distance (the stroke) from one end point to the opposite end point. For example, when the third direction is a direction parallel to the upward-downward direction, the second frame 300 may move within the range between a point at which the second frame 300 is located at the lowest position with respect to the first frame 200 and a point at which the second frame 300 is located at the highest position with respect to the first frame 200.

The left edge and the right edge of the first frame 200 may be formed in a shape suitable for guiding smooth movement of the flexible display 500.

In some implementations, a left guide 202 may extend along the left edge of the first frame 200 in the third direction, and a right guide 201 may extends along on the right edge of the first frame 200 in the third direction.

The left guide 202 and the right guide 201 may have concave grooves formed therein so as to face each other. Each groove may be formed to have a constant cross-section in the third direction.

The left edge 302 of the second frame 300 may be inserted into the groove in the left guide 202, and the right edge 301 of the second frame 300 may be inserted into the groove in the right guide 201. Accordingly, the second frame 300 may move in the third direction with respect to the first frame 200.

The flexible display 500 is coupled to the first frame 200 and the second frame 300 in the state of being bent overall. The flexible display 500 may be bent in a "U" shape overall, or may be bent in a "J" shape overall (see FIGS. 8A and 8B).

A portion of the flexible display 500 is coupled to the second frame 300. The flexible display 500 is coupled to the front side of the second frame 300 in the first direction.

The portion of the flexible display 500 that is coupled to the second frame 300 moves together with the second frame 300. When the second frame 300 moves with respect to the first frame 200, the overall shape of the flexible display 500 changes.

A portion of the flexible display 500 is exposed in front of the first frame 200 and the second frame 300 so as to be oriented in the first direction, and the exposed area of the flexible display 500 that is oriented in the first direction is variable.

When the third direction is a direction parallel to the upward-downward direction, the case in which the second frame 300 is located at the lowest position with respect to the first frame 200 corresponds to the state in which the exposed area of the flexible display 500 that is oriented in the first direction is the smallest (see FIG. 2A), and the case in which the second frame 300 is located at the highest position with respect to the first frame 200 corresponds to the state in which the exposed area of the flexible display 500 that is oriented in the first direction is the largest (see FIG. 2B).

As such, the vehicle display device 100 is transformed between the state in which the exposed area of the flexible display 500 that is oriented in the first direction is the smallest (the first state) and the state in which the exposed area of the flexible display 500 that is oriented in the first direction is the largest (the second state). Further, the vehicle display device 100 may be maintained in the first state, the second state, or an arbitrary state between the first state and the second state.

The vehicle display device 100 may include a driving sensor.

The driving sensor may be a part of the above-described sensor 140, and may be configured to sense the state of the driver. The driving sensor may be implemented as an image sensor, a camera, or the like, and may sense the appearance and state of the occupant.

The controller 180 may be configured to control the vehicle display device 100 according to the driving state of the vehicle or a signal from the driving sensor.

The vehicle may be driven in a manual driving mode by direct driving of the driver, or may also be driven in an autonomous driving mode.

When the vehicle is driven in the manual driving mode by the driver, the vehicle display device 100 may be in the first state or the second state, and an image may be displayed on the flexible display 500.

When the vehicle is driven in the autonomous driving mode, the vehicle display device 100 may be in the first state.

When the driving sensor senses carelessness of the driver (for example, a case in which the driver does not keep his or her eyes on the road), the vehicle display device 100 may change from the first state to the second state, and a warning image may be displayed to the driver through the flexible display 500.

When the camera or another sensor installed in the vehicle senses a dangerous situation (for example, a case in which the speed at which the following vehicle is approaching exceeds a reference value, or a case in which the distance to the preceding vehicle is equal to or less than a reference value), the vehicle display device 100 may display a warning image corresponding to the dangerous situation to the driver through the flexible display 500 in the first state or the second state.

Figure 4:
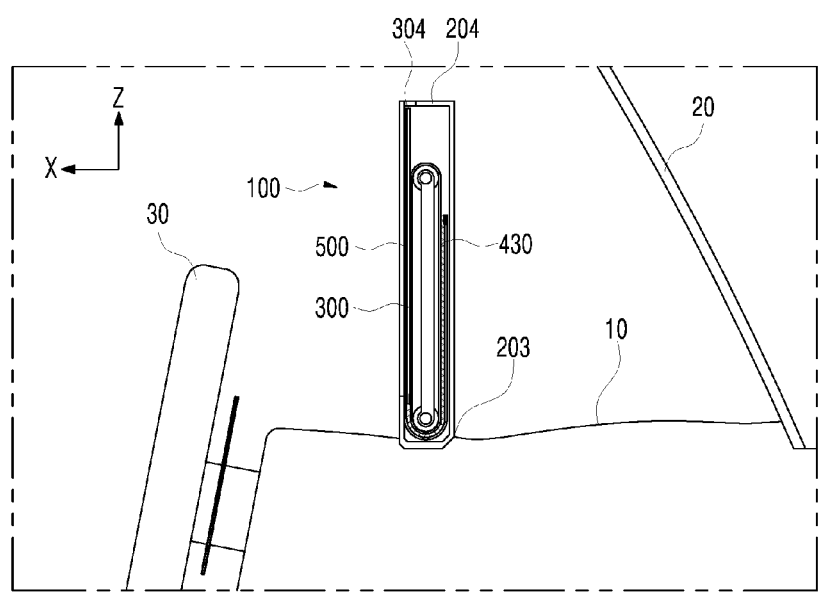
FIG. 4 is a cross-sectional view schematically showing an example configuration of the vehicle display device mounted to a dashboard, where
Figure 5A:
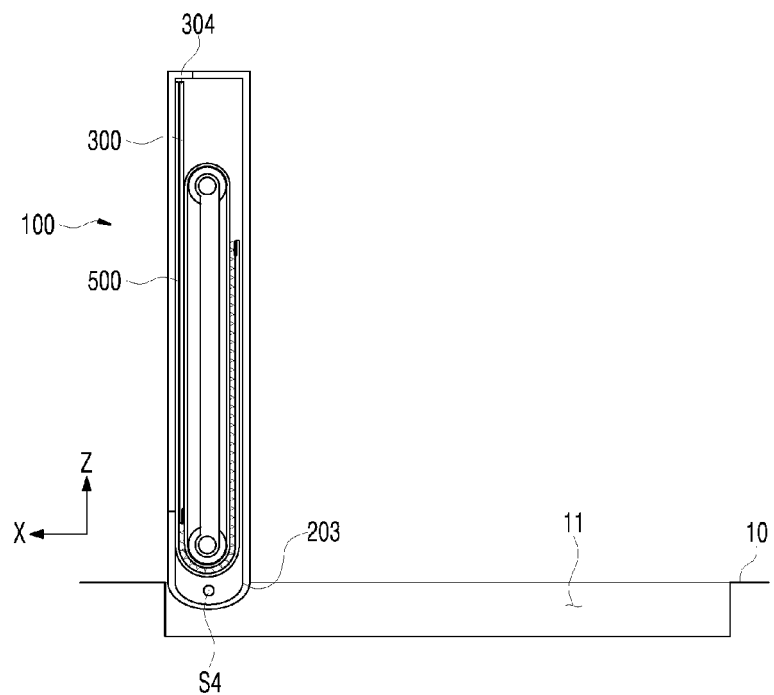
FIGS. 5A and 5B are cross-sectional views schematically showing an example configuration of the vehicle display device mounted to a dashboard, where
Figure 5B:
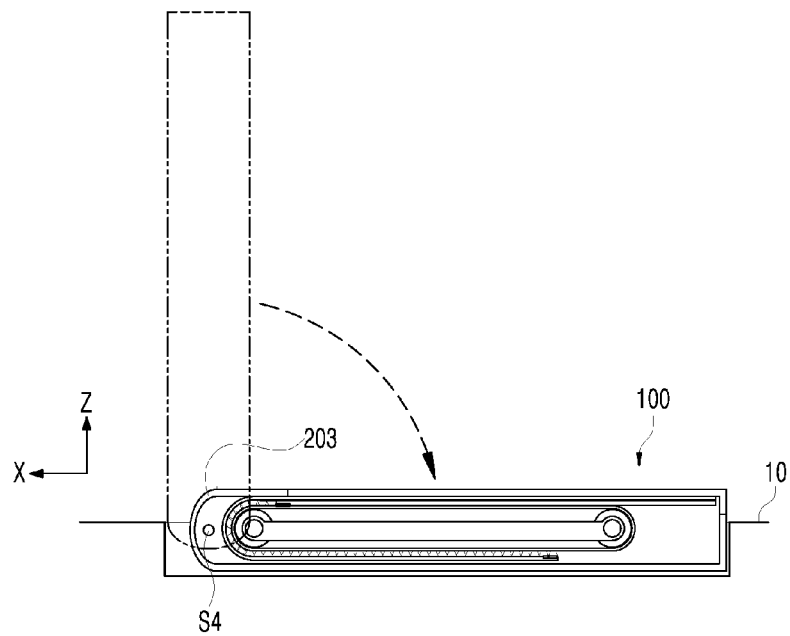
Figure 6:
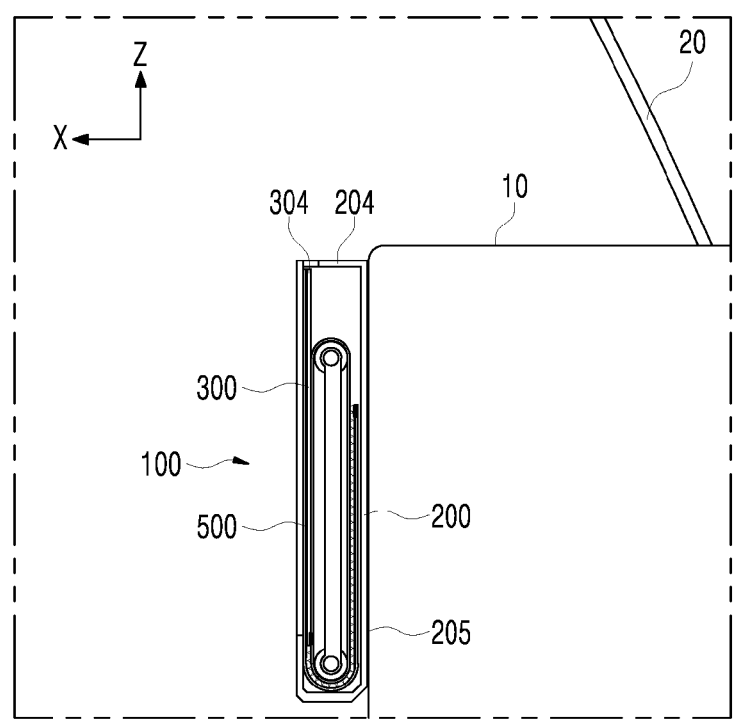
FIG. 6 is a cross-sectional view schematically showing an example configuration of the vehicle display device mounted to a dashboard, where

FIG. 4 is a cross-sectional view schematically showing an example configuration in which a vehicle display device 100 is mounted to the dashboard 10, FIGS. 5A and 5B are cross-sectional views schematically showing an example configuration in which a vehicle display device 100 is mounted to the dashboard 10, and FIG. 6 is a cross-sectional view schematically showing an example configuration in which a vehicle display device 100 is mounted to the dashboard 10. FIG. 6 is a cross-sectional view taken along line A-A' in FIG. 3A.

The dashboard 10 described in some implementations is a dashboard of a vehicle, which is a part provided in front of the driver seat and the front passenger seat, in which various gauges, control devices, storage boxes, and other accessories are mounted.

The vehicle display device 100 may be mounted to the dashboard 10 of the vehicle in the interior of the vehicle (inside a windshield 20). That is, the vehicle display device 100 may be mounted in the interior of the vehicle at a point between the windshield 20 and the steering wheel 30 in the forward-backward direction of the vehicle.

In the vehicle display device 100, the lower portion 203 of the first frame 200 may be coupled to the dashboard 10, and the upper end 204 of the first frame 200 and the upper end 304 of the second frame 300 may be located at a higher position than the portion of the dashboard 10 to which the first frame 200 is coupled. That is, the vehicle display device 100 may be coupled to the dashboard 10 in a form protruding upwards above the dashboard 10 as a whole.

In some implementations, the lower portion 203 of the first frame 200 may be a portion that forms a relatively lower side of the first frame 200. That is, the entirety or a portion of the region (the region from the lower end to the middle portion of the first frame 200) below half the height of the first frame 200 in the upward-downward direction (the distance from the lower end to the upper end of the first frame 200) may be the lower portion 203.

In some implementations, the first frame 200 may be fixedly coupled to the dashboard 10 so as to remain stationary.

In some implementations, the first frame 200 may be rotatably coupled to the dashboard 10. In detail, the lower portion 203 of the first frame 200 may be rotatably coupled to the dashboard 10 (see FIGS. 5A and 5B).

In this case, a rotary shaft S4 of the first frame 200 may be disposed in the second direction.

Accordingly, the vehicle display device 100 may be erected vertically or laid horizontally. The dashboard 10 may have an accommodation recess 11 formed therein to accommodate therein the vehicle display device 100 laid horizontally.

The vehicle display device 100 may be configured such that the rear surface 205 of the first frame 200 (the surface forming the rear side of the first frame 200 in the first direction) is coupled to the dashboard 10.

In the first state, the upper end 304 of the second frame 300 may be located at a lower position than the portion of the dashboard 10 to which the first frame 200 is coupled. In the second state, the upper end 304 of the second frame 300 may be located at a higher position than the portion of the dashboard 10 to which the first frame 200 is coupled.

Figure 7A:
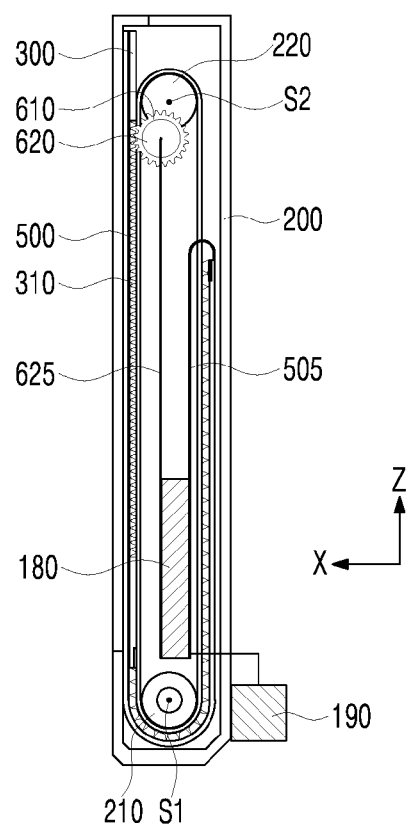
FIGS. 7A and 7B are cross-sectional views showing the vehicle display device, where
Figure 7B:
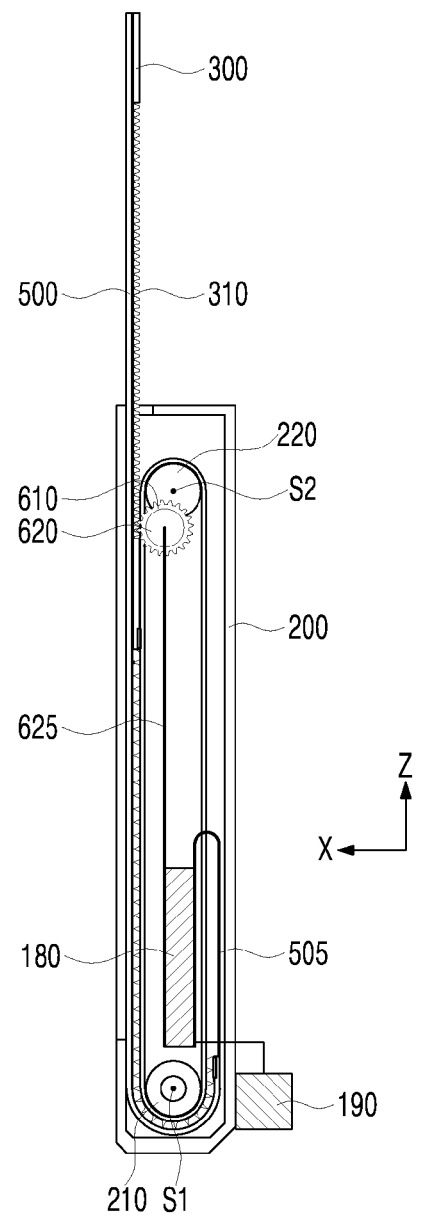

FIGS. 7A and 7B are cross-sectional views showing an example of a vehicle display device 100. FIG. 7A illustrates an example of a first state, and FIG. 7B illustrates an example of a second state. FIG. 7A is a cross-sectional view taken along line B-B' in FIG. 3A, and FIG. 7B is a cross-sectional view taken along line D-D' in FIG. 3B.

Figure 8A:
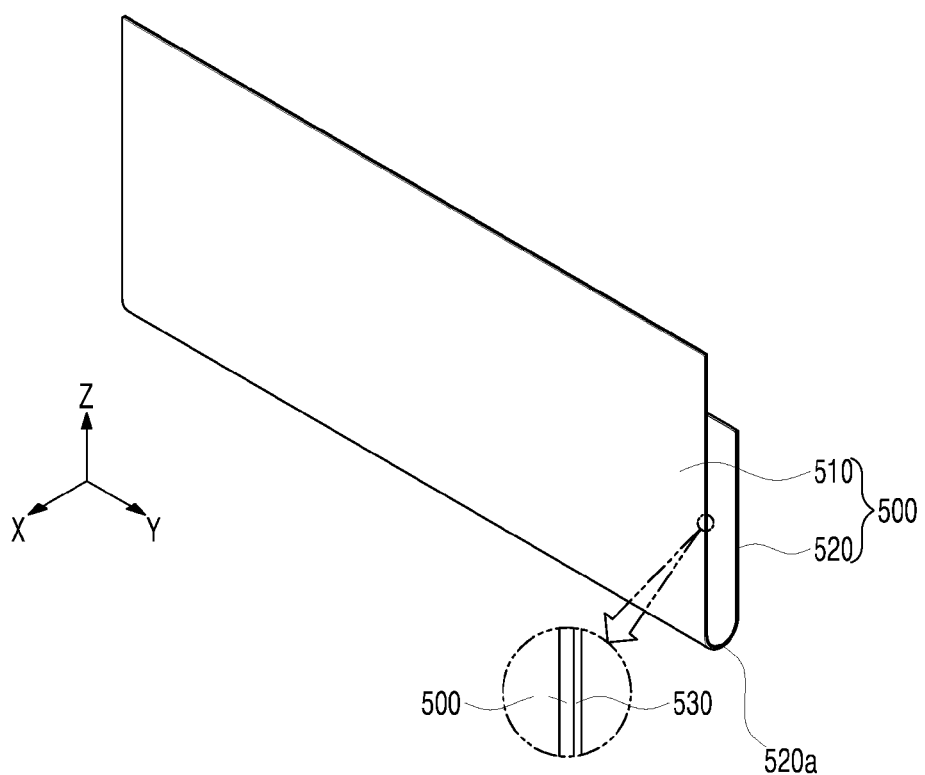
FIG. 8A is a perspective view schematically showing an example of a flexible display in a first state.
Figure 8B:
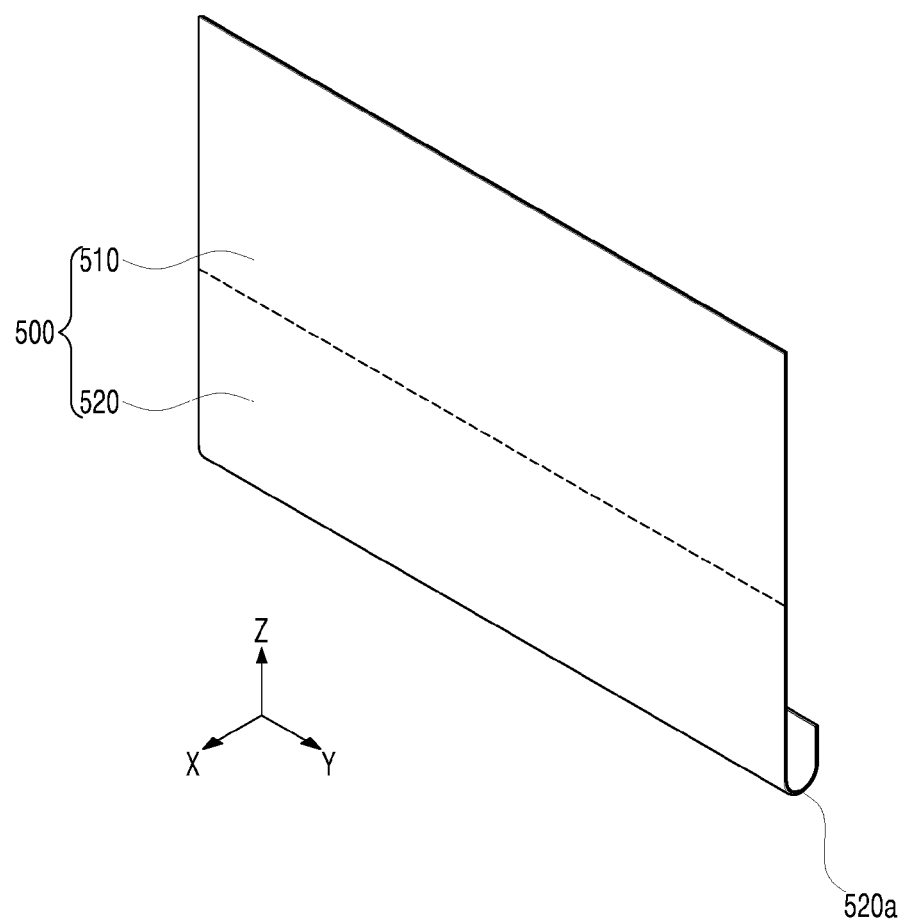
FIG. 8B is a perspective view schematically showing the flexible display in a second state.

FIG. 8A is a perspective view schematically showing the flexible display 500 in the first state, and FIG. 8B is a perspective view schematically showing the flexible display 500 in the second state.

In the vehicle display device 100, the flexible display 500 may include a first area 510 and a second area 520.

The first area 510 may be an area that overlaps the first surface 300a, which is the outer surface of the second frame 300, and is exposed. The first area 510 may be an exposed area of the flexible display 500 when viewed from the front in the first state.

The first area 510 may form a planar surface in the first state and the second state.

The second area 520 may be an area that overlaps the outer surface of a driving track 400, excluding the first area 510. The second area 520 may be an area of the flexible display 500 excluding the exposed area of the flexible display 500 corresponding to the first area 510 when viewed from the front in the second state.

The vehicle display device 100 may be configured such that the size of the second area 520 that is exposed together with the first area 510 at the same side as the first area 510 changes according to movement of the second frame 300.

The second area 520 may be configured such that a middle portion 520a thereof forms a curved surface and the remaining portion thereof forms a planar surface.

In the first state, the portion of the second area 520 that forms a planar surface is located opposite the first area 510 (i.e. is oriented in the opposite X-axis direction).

When the vehicle display device changes from the first state to the second state, the middle portion 520a of the second area 520 that forms a curved surface may be transformed into a portion forming the same planar surface as the first area 510, and the remaining portion of the second area 520, which is located opposite the first area 510, may be transformed into the middle portion 520a forming a curved surface.

In some implementations, the second frame 300 may be made of a solid material so that the shape thereof is maintained. For example, the second frame 300 may be made of metal, plastic, or a combination thereof.

In addition, the vehicle display device 100 may include an actuator 600.

The actuator 600 may be configured to move the second frame 300 upwards and downwards with respect to the first frame 200.

In some implementations, the actuator 600 may be implemented as any of various devices for realizing linear reciprocating movement of the second frame 300.

In some implementations, the actuator 600 may be configured to realize reciprocating movement of the second frame 300 via another mechanism. For example, the actuator 600 may be configured to directly rotate a first roller 210 and/or a second roller 220, which will be described below, or may be configured to directly rotate the driving track 400. To this end, the actuator 600 may include a motor, and may be coupled to the rotary shaft of the first roller 210 and/or the second roller 220.

In some examples, the actuator 600 may be configured to directly realize reciprocating movement of the second frame 300.

In the vehicle display device 100, the teeth of a first gear 310 may be successively formed on a second surface 300b, which is the inner surface (the rear surface in the X-axis direction) of the second frame 300, in the moving direction of the second frame 300. That is, the teeth of the first gear 310 may be successively formed on the second surface 300b of the second frame 300 in the upward-downward direction (the Z-axis direction). The first gear 310 may be formed as a rack gear. The direction perpendicular to the second surface 300b may be a direction that is oriented toward the front side of the vehicle.

The actuator 600 may include a driving gear 610 and a driving motor 620 (see FIGS. 3A, 3B, 7A, and 7B).

The driving gear 610 is coupled to the inner side of the first frame 200 so as to be rotatable about a third rotary shaft S3 thereof, and interlocks with the first gear 310 of the second frame 300 so as to be rotated thereby. The driving gear 610 may be formed as a pinion gear. The third rotary shaft S3 of the driving gear 610 is disposed parallel to a first rotary shaft S1 of the first roller 210.

The driving motor 620 may be configured as a normal motor which rotates by electric energy, and may be configured as a step motor. The driving motor 620 is directly coupled to the driving gear 610 to rotate the driving gear 610, or may rotate the driving gear 610 by means of another gear. The driving motor 620 may be fixedly coupled to the inner side of the first frame 200.

The driving gear 610 may be located above the first roller 210 in the vehicle display device 100. The driving gear 610 may be disposed so as to be substantially aligned with the second roller 220 in the upward-downward direction.

In the vehicle display device 100, the gear module of each of the gear 310 of the second frame 300 and the driving gear 610 may be 0.3 mm, in order to secure smooth movement of the second frame 300.

In the vehicle display device 100, the flexible display 500 and the actuator 600 may be configured to receive power from the vehicle, and the power supply 190 for supplying power to the flexible display 500 and the actuator 600 may be provided at one side of the first frame 200. The power supply 190 may be implemented as an electric terminal, an electric connector, or any of various devices for electrically connecting the power source of the vehicle to the vehicle display device 100.

Accordingly, the vehicle display device 100 does not need a separate battery. Electric wires 505 and 625 for supplying power to the flexible display 500 and to the actuator 600 and the controller 180 may be disposed in the space defined by the first area 510 and the second area 520 of the flexible display 500. The electric wires 505 and 625 for supplying power to the flexible display 500 and to the actuator 600 may be formed as a flexible printed circuit board (FPCB).

As such, in the vehicle display device 100, the flexible display 500 and the actuator 600 receive power from the vehicle through the electric wires disposed in the space defined by the first area 510 and the second area 520 of the flexible display 500, and it may be possible to prevent or reduce an increase in the thickness of the vehicle display device 100 due to wiring.

Figure 9A:
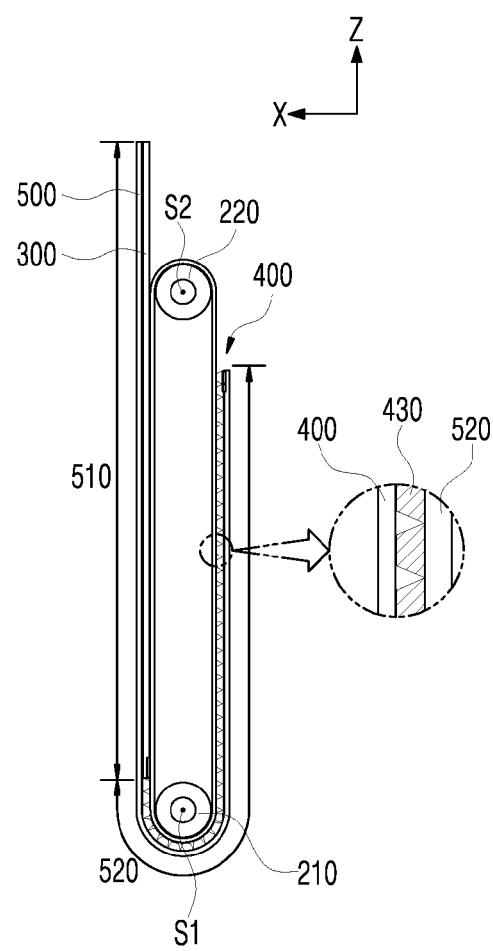
FIGS. 9A, 9B, and 9C are cross-sectional views showing example components of a vehicle display device.
Figure 9B:
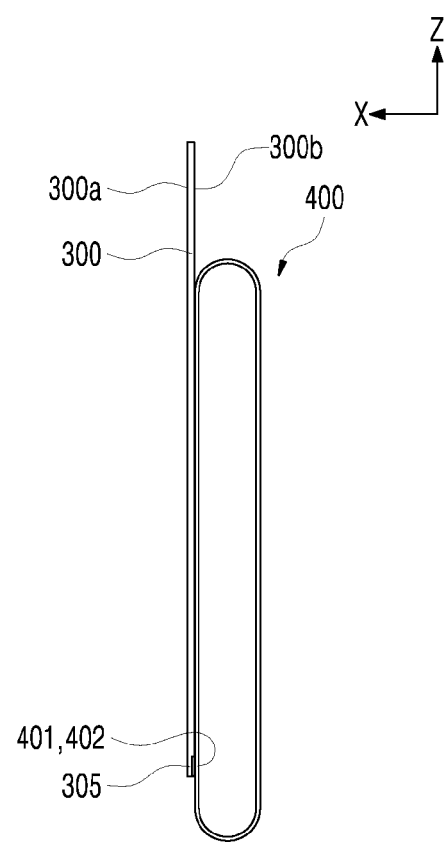
Figure 9C:
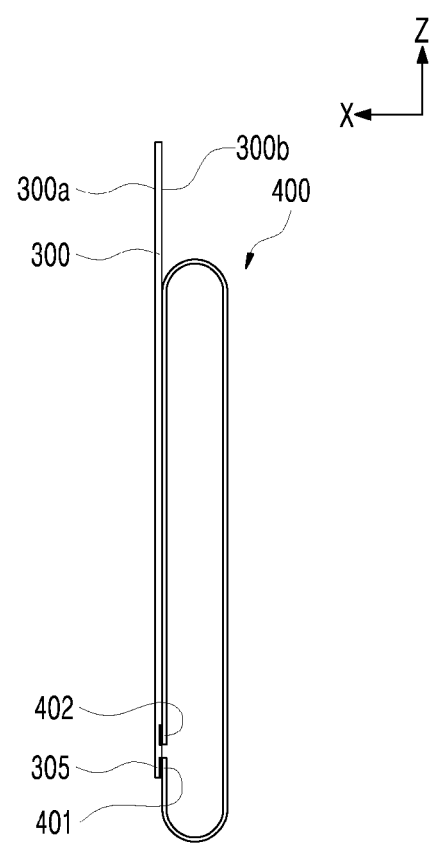

FIGS. 9A, 9B, and 9C are cross-sectional views showing example components of a vehicle display device 100.

The vehicle display device 100 may be configured such that tension is uniformly applied to the flexible display 500 when the vehicle display device 100 changes from the first state to the second state (the case in which the exposed area of the flexible display 500 that is oriented in the first direction increases) and when the vehicle display device 100 changes from the second state to the first state (the case in which the exposed area of the flexible display 500 that is oriented in the first direction decreases). This will be described below.

In the following description, the forward direction is defined as a first direction, and the upward direction is defined as a third direction, unless otherwise defined.

The vehicle display device 100 includes a first roller 210, a second roller 220, and a driving track 400.

The first roller 210 may be coupled to the first frame 200 so as to perform clockwise and counterclockwise rotation (hereinafter, referred to as "reciprocating rotation") about a first rotary shaft S1 thereof. The first rotary shaft S1 of the first roller 210 is disposed in the second direction.

The first roller 210 is located behind the second frame 300 in the first direction.

The first roller 210 may have a cylindrical shape with respect to the first rotary shaft S1 as a central axis. The driving track 400 is locked to the first roller 210, and when the driving track 400 is moved (rotated), the first roller 210 may rotate so as to smoothly move (rotate) the driving track 400.

The second roller 220 may be spaced apart from the first roller 210, and may be coupled to the first frame 200 so as to perform reciprocating rotation about a second rotary shaft S2 thereof, which is parallel to the first rotary shaft S1.

The second roller 220 is located behind the second frame 300 in the first direction.

When the third direction is a direction parallel to the upward-downward direction, the second roller 220 is located above the first roller 210.

The second roller 220 may have a cylindrical shape with respect to the second rotary shaft S2 as a central axis. The driving track 400 is locked to the second roller 220, and when the driving track 400 is moved (rotated), the second roller 220 may rotate so as to smoothly move (rotate) the driving track 400.

The rotation direction of the second roller 220 coincides with the rotation direction of the first roller 210.

The driving track 400 is configured such that at least a part thereof is bendable, and is disposed such that the driving track 400 encloses the first roller 210 and the second roller 220. That is, an inner surface of a part of the driving track 400 may be in close contact with the outer surface of the first roller 210, and an inner surface of another part of the driving track 400 may be in close contact with the outer surface of the second roller 220.

In the vehicle display device 100, the driving track 400 disposed around the first roller 210 and the second roller 220 may be formed to be applied with a predetermined tension, without becoming loose. The tension may be adjusted based on the length of the driving track 400, the distance between the first roller 210 and the second roller 220, whether a separate roller is included, and the like.

The driving track 400 may include a metal plate, a plastic film, or the like.

The driving track 400 may be configured to include a first coupling 401 which forms one end thereof, and a second coupling 402 which is connected to the first coupling 401 and forms the other end thereof.

In some implementations of the present disclosure, the driving track 400 may be formed as a closed loop (a circulating loop). That is, the driving track 400 may be formed as a continuous loop without an open end. The first coupling 401 and the second coupling 402 form the same point in the loop (see FIG. 9B).

As such, the driving track 400 may be formed as a closed loop or a continuous track. In this case, the first coupling 401 and the second coupling 402 may be coupled to the lower side of the second frame 300. The first coupling 401 and the second coupling 402 may be coupled to the lower end 305 of the second frame 300.

Due to this configuration, the reciprocating movement range (stroke) of the second frame 300 with respect to the first frame 200 may be maximized.

The vehicle display device 100 may include a plurality of support bars 430. The support bars 430 may be coupled to the inner surface of the flexible display 500 to support the flexible display 500.

In particular, the support bars 430 may be coupled to the inner surface of the second area 520 of the flexible display 500 to support the second area 520.

The support bars 430 may be formed of a relatively solid material to support the flexible display 500. For example, the support bars 430 may be formed of plastic, metal, or the like.

The support bars 430 may be formed to extend in a direction parallel to the first rotary shaft S1 (i.e. in the Y-axis direction), and may have a constant cross-section in the direction parallel to the first rotary shaft S1. The shape of the cross-section of each support bar 430 may be a trapezoidal shape (a shape in which the width of each support bar gradually decreases as the distance from the rear surface of the flexible display increases).

In the case in which the plurality of support bars 430, arranged successively, forms the same plane as the second frame 300, the thickness of each support bar 430 may be the same as the thickness of the second frame 300 so that the region (the second area 520) of the flexible display 500 that is supported by the support bars 430 is stably maintained together with the region (the first area 510) of the flexible display 500 that is supported by the second frame 300.

In some implementations, the first coupling 401 and the second coupling 402 may form two separated ends of the driving track 400. That is, the driving track 400 may be formed as an open loop (see FIG. 9C).

In this case, the first coupling 401 may be coupled to the lower end 305 of the second frame 300, and the second coupling 402 may be coupled to the second frame 300 at a higher position than the first coupling 401. That is, the first coupling 401 and the second coupling 402 may be spaced apart from each other, but the driving track 400 may instead be coupled to the second frame 300. Thus, the driving track 400 may form a closed loop or a continuous track together with the second frame 300.

Figure 10A:
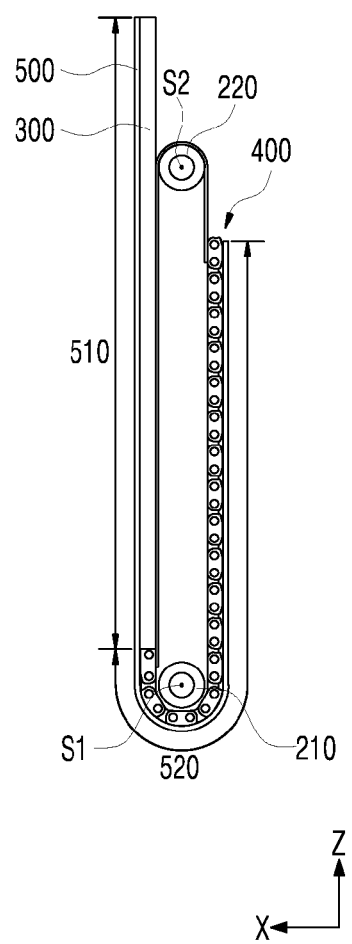
FIGS. 10A and 10B are cross-sectional views showing example components of a vehicle display device.
Figure 10B:
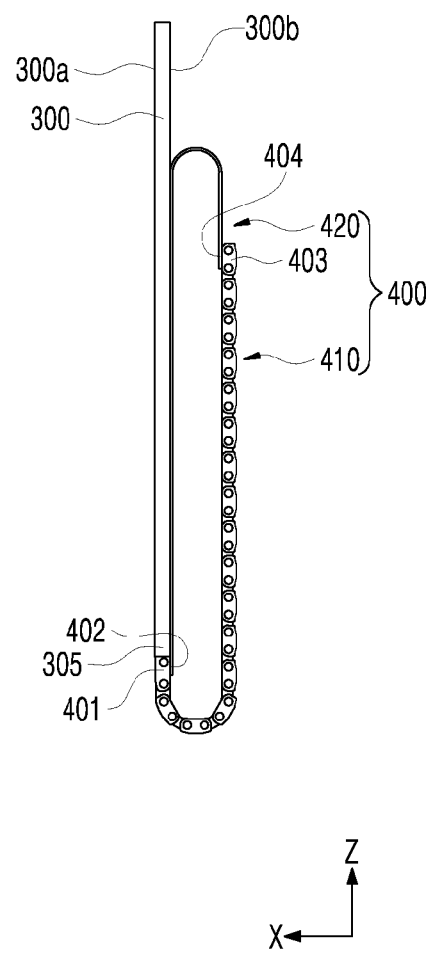

FIGS. 10A and 10B are cross-sectional views showing example components of a vehicle display device 100.

In some implementations, the driving track 400 may include a chain 410 and a guide plate 420. The chain 410 may be in contact with or coupled to the inner surface of the flexible display 500 to support the flexible display 500.

In particular, the chain 410 may be in contact with or coupled to the inner surface of the second area 520 of the flexible display 500 to support the second area 520.

The chain 410 and the guide plate 420 will be described in more detail below.

In the description of the vehicle display device 100, the longitudinal direction of the driving track 400 may be any direction perpendicular to the second direction (the Y-axis direction), and may also be any direction in which the driving track 400 rotates about the first rotary shaft S1 or the second rotary shaft S2.

In the description of the vehicle display device 100, the longitudinal direction of the driving track 400 may be a direction oriented from the first coupling 401 to the second coupling 402 along the portion thereof wound around the first roller 210 and the portion thereof wound around the second roller 220, or may be a direction opposite thereto.

In some cases, the flexible display 500 may be implemented as a single display. A portion of the flexible display 500 may be coupled to the outer surface of the second frame 300, and the remaining portion thereof may be coupled to the outer surface of the driving track 400.

In detail, the middle portion 520a of the flexible display 500 is bent to form the lowest portion thereof. The outer surface (the surface on which an image is displayed) of the flexible display 500 that extends from the middle portion 520a and is located at the front side is oriented forwards. The outer surface of the flexible display 500 that extends from the middle portion 520a and is located at the rear side is oriented backwards.

In some implementations, the flexible display 500 may be formed so as not to overlap itself. The overall length of the flexible display 500 (the length when spread straight) may be less than the overall length of the driving track 400 (the length when spread straight).

In some implementations, when the vehicle display device 100 changes from the first state to the second state, the second frame 300 moves upwards, and the driving track 400 is tensioned while rotating in the clockwise direction on the basis of FIG. 7A. Tension is applied uniformly to the entirety of the driving track 400. Accordingly, no portion of the driving track 400 is crooked.

In this case, the flexible display 500 coupled to the outer surfaces of the second frame 300 and the driving track 400 moves together with the second frame 300 and the driving track 400. Thereby, the tension applied to the flexible display 500 may be maintained constant.

In the vehicle display device 100, when the vehicle display device 100 changes from the second state to the first state, the second frame 300 moves downwards, and the driving track 400 is tensioned while rotating in the counterclockwise direction on the basis of FIG. 7B. Tension may be applied uniformly to the entirety of the driving track 400.

In this case, the flexible display 500 coupled to the outer surfaces of the second frame 300 and the driving track 400 moves together with the second frame 300 and the driving track 400. Thereby, the tension applied to the flexible display 500 may be maintained constant.

The chain 410 may be formed of a rigid material so as to maintain its shape. The chain 410 may be formed of metal or plastic, or formed to include the same.

The chain 410 may be configured to include a plurality of links 411 and 412 which are connected to each other.

One end portion of the chain 410 in the longitudinal direction may be coupled to the second frame 300, and the opposite end portion of the chain 410 in the longitudinal direction may be coupled to the guide plate 420. The plurality of links 411 and 412, arranged successively in the longitudinal direction, may be formed in the same shape as each other, except for the parts thereof that are coupled to the second frame 300 and the parts thereof that are coupled to the guide plate 420. The cross-section of each of the links 411 and 412 may be uniform in the leftward-rightward direction.

Each of the links 411 and 412 constituting the chain 410 may have a constant thickness (a width in the forward-backward direction when the links are oriented in the upward-downward direction). The thickness of each of the links 411 and 412 may be the same as or similar to the thickness (the width in the upward-downward direction) of the second frame 300.

The portion of the chain 410 that is coupled to the second frame 300 may be a first coupling 401, and the first coupling 401 and the link adjacent thereto may be rotatably coupled to each other. Further, the first coupling 401 may be rotatably coupled to the second frame 300. In this case, the thickness of the first coupling 401 may be the same as or similar to the thickness of the second frame 300.

When the first coupling 401 is rotatably coupled to the second frame 300, the rotary shaft thereof is disposed parallel to the first rotary shaft S1. When the first coupling 410 is rotatably coupled to the link adjacent thereto, the rotary shaft thereof is disposed parallel to the first rotary shaft S1.

The first coupling 401 is configured to reciprocate in the upward-downward direction in the first frame 200. The first coupling 401 is located in front of the first rotary shaft S1 and the second rotary shaft S2.

The portion of the chain 410 that is wound around the first roller 210 may be bent, and the remaining portion thereof may be tensioned and straight.

A first intermediate coupling 403 of the chain 410 which is coupled to the guide plate 420 may be rotatably coupled to the immediately adjacent link.

The first intermediate coupling 403 is configured to reciprocate in the upward-downward direction in the first frame 200. The first intermediate coupling 403 is located behind the first rotary shaft S1 and the second rotary shaft S2.

At least a part of the guide plate 420 may be formed of a metal plate having elasticity. The guide plate 420 may be formed of a super elastic metal.

The guide plate 420 may be formed of a super elastic wire, a Flexinol wire, or a shape-memory alloy, or configured to include the same.

The guide plate 420 may be formed as a relatively thin plate. The guide plate 420 may be formed to have an arbitrary thickness within a range of 0.05 to 0.2 mm, and may be formed to have a thickness of 0.1 mm.

Two or more guide plates 420 may be provided in one driving track 400.

One end of the guide plate 420 is coupled to the chain 410 and the other end forms the second coupling 402.

A second intermediate coupling 404 of the guide plate 420, which is connected to the chain 410, may be fixedly coupled to the first intermediate coupling 403. The first intermediate coupling 403 and the second intermediate coupling 404 may be coupled to each other by a fastening part such as a bolt, or may be coupled to each other by locking, adhesion, welding, or the like.

The second coupling 402 of the guide plate 420 may be coupled to the first coupling 401 or coupled to the second frame 300.

When the second coupling 402 is coupled to the second frame 300, the second coupling 402 may be tightly coupled to the lower surface of the second frame 300. The second coupling 402 and the second frame 300 may be coupled to each other by a fastening part such as a bolt, or may be coupled to each other by locking, adhesion, welding, or the like.

When the second coupling 402 is coupled to the second frame 300, the second coupling 402 is coupled to a point close to the lower end 305 of the second frame 300. That is, the second coupling 402 is coupled to the second frame 300 at a point located below the center between the upper end and the lower end of the second frame 300.

Figure 11:
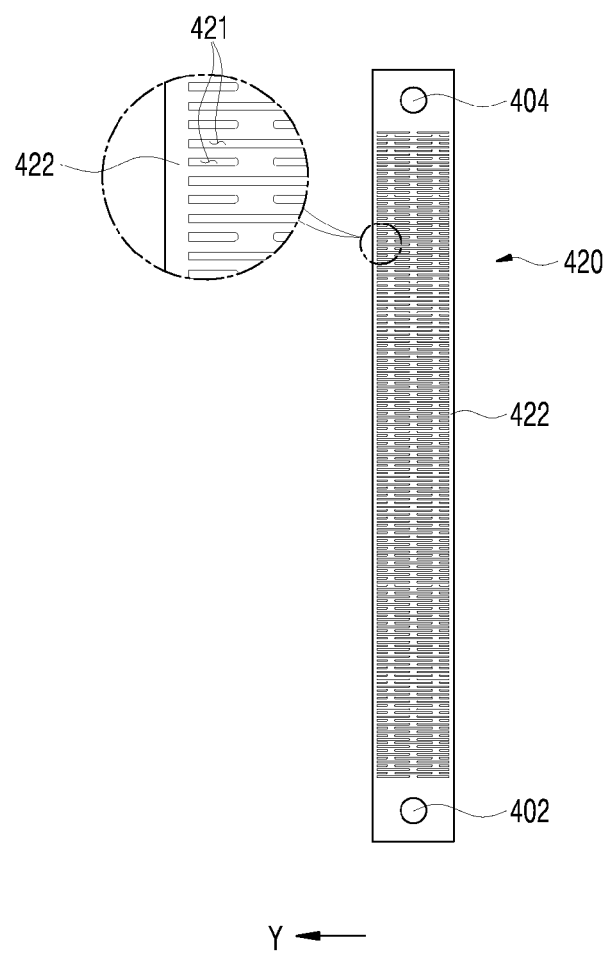
FIG. 11 is a plan view showing an example of a guide plate and an example of a pattern of the guide plate in an enlarged manner.

FIG. 11 is a plan view showing a guide plate 420.

The guide plate 420 may be configured to include a pair of supports 422 and first through-holes 421.

The supports 422 may define both edges of the guide plate 420 along the longitudinal direction thereof. The supports 422 may form a linear shape as a whole.

The first through-holes 421 are formed through the guide plate 420 between the supports 422 in the thickness direction of the guide plate 420, and extend in the width direction of the guide plate 420 (in the leftward-rightward direction). The first through-holes 421 may be repeatedly formed along the longitudinal direction of the guide plate 420, and also repeatedly formed along the width direction of the guide plate 420.

Since the first through-holes 421 formed to be elongated in the width direction in the guide plate 420 are repeatedly formed in the guide plate 420, the guide plate 420 can be easily bent with respect to the rotation axis of the width direction.

Since the guide plate 420 includes the supports 422 and the first through-holes 421, when the guide plate 420 is bent about the second rotary shaft S2 of the second roller 220, elastic deformation of the guide plate 420 may be facilitated, and control of springback thereof may also be facilitated.

Figure 12:
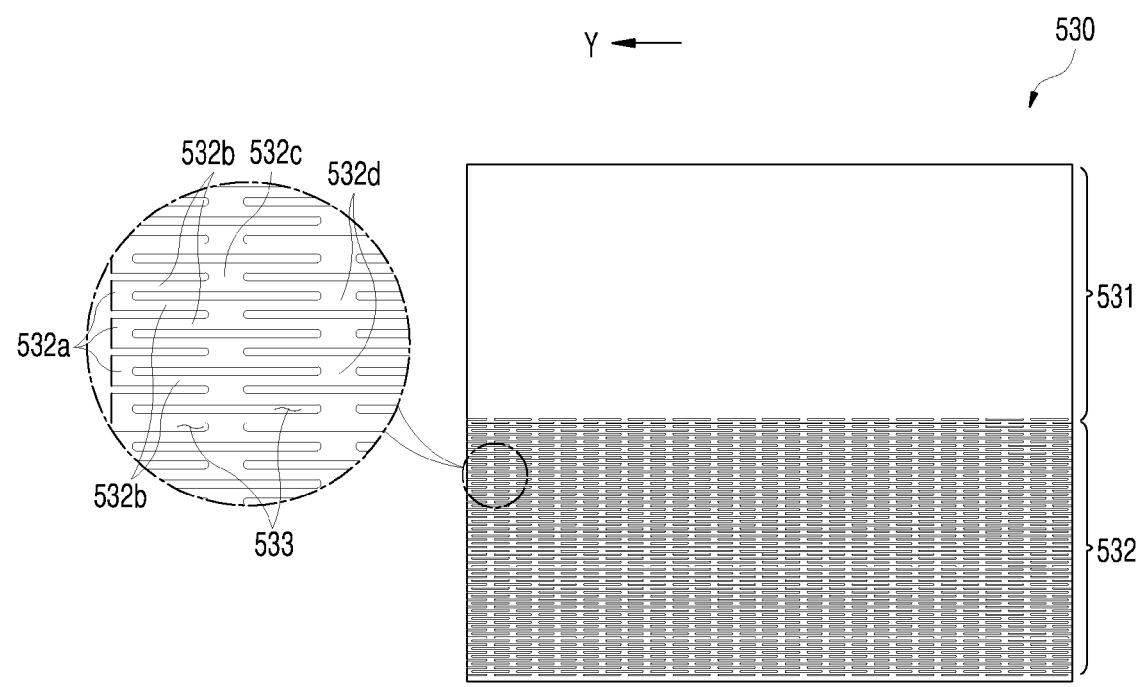
FIG. 12 is a plan view showing an example of a backplate and an example of a pattern of the backplate in an enlarged manner.

FIG. 12 is a plan view showing a backplate 530. FIG. 12 also illustrates the pattern of the backplate 530 in an enlarged manner.

In the vehicle display device 100, the backplate 530 may be stacked on and coupled to the inner surface of the flexible display 500.

The backplate 530 may be formed of a metal plate having elasticity. The backplate 530 may be configured to include a super elastic metal.

The backplate 530 may allow the flexible display 500 to be smoothly elastically deformed and elastically restored.

The backplate 530 may be formed as a relatively thin plate. The backplate 530 may be formed to have an arbitrary thickness within a range of 0.05 to 0.2 mm, and may be formed to have a thickness of 0.1 mm.

In the vehicle display device 100, the backplate 530 may be formed of a metal plate as a whole, and may be divided into two or more areas.

In detail, the backplate 530 may include a fixed area 531 and a transformable area 532.

The fixed area 531 overlaps the inner surface of the first area 510, and also overlaps the outer surface of the second frame 300. The fixed area 531 may be formed in a flat metal plate shape overall. The fixed area 531 may be formed to be symmetrical in the leftward-rightward direction.

The transformable area 532 overlaps the inner surface of the second area 520, and also overlaps the outer surface of the driving track 400. The transformable area 532 has a plurality of second through-holes 533 formed therethrough. The second through-holes 533 are formed to extend in the width direction (the leftward-rightward direction). That is, a plurality of through-holes 533 is formed through the transformable area 532 in the thickness direction of the backplate 530.

The transformable area 532 may be formed to be symmetrical in the leftward-rightward direction.

The transformable area 532, in which the plurality of second through-holes 533 is formed, may include edges 532a, horizontal connectors 532b, and first vertical connectors 532c.

The edges 532a are divided into a plurality of edges to form a left edge and a right edge of the backplate 530. The edges 532a have a predetermined length in the longitudinal direction, and are spaced apart from each other.

The horizontal connectors 532b extend from the edges 532a in the width direction. Two horizontal connectors 532b extend from one edge 532a.

One first vertical connector 532c connects two horizontal connectors 532b extending from different edges 532a. That is, one first vertical connector 532c connects two horizontal connectors 532b that extend from two adjacent edges 532a and are adjacent to each other. The first vertical connectors 532c may be repeatedly formed in the width direction (the leftward-rightward direction), and the first vertical connectors 532c may be spaced apart from each other at regular intervals.

Second vertical connectors 532d may be formed in the transformable area 532, and one second vertical connector 532d connects two horizontal connectors 532b extending from the same edge 532a. The second vertical connectors 532d may be repeatedly formed in the width direction (the leftward-rightward direction), and the second vertical connectors 532d may be spaced apart from each other at regular intervals.

As described above, since the second through-holes 533, which are long in the width direction, are repeatedly formed through the transformable area 532, the transformable area 532 may be easily bent about the rotation axis of the width direction.

When a tensile force, which is an external force, is applied to the transformable area 532 in the longitudinal direction, the edges 532a and the first vertical connectors 532c may be deformed so as to be spaced apart from each other in the longitudinal direction with respect to the horizontal connectors 532b, and the length of the transformable area 532 may increase over the entire area of the transformable area 532. When the external force is removed, the transformable area 532 may be elastically restored to the original state thereof.

Further, when a tensile force, which is an external force, is applied to the transformable area 532 in the longitudinal direction, the first vertical connectors 532c and the second vertical connectors 532d may be deformed so as to be spaced apart from each other in the longitudinal direction with respect to the horizontal connector 532b, and the length of the transformable area 532 may increase over the entire area of the transformable area 532. When the external force is removed, the transformable area 532 may be elastically restored to the original state thereof.

Since the backplate 530 includes the transformable area 532, the region of the flexible display 500 that overlaps the outer surface of the driving track 400 may be more flexibly deformed. Further, the flexible display 500 may be easily elastically deformed and easily control the springback when the flexible display 500 is bent with respect to the first rotary shaft S1 of the first roller 210.

Further, since the backplate 530 includes the transformable area 532, the flexible display 500 may be elastically deformed within a predetermined range in the longitudinal direction.

Figure 13A:
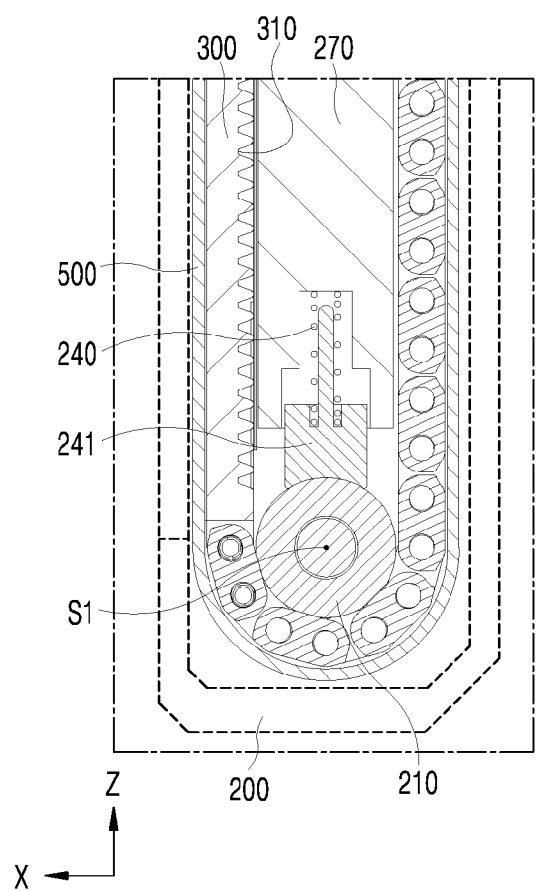
FIGS. 13A and 13B are cross-sectional views showing an example portion of a vehicle display device when viewed from different points.
Figure 13B:
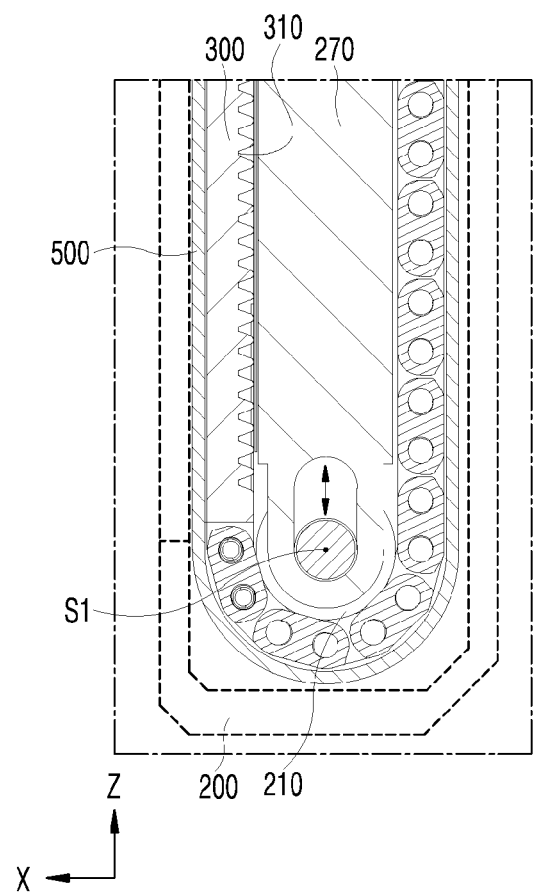

FIGS. 13A and 13B are cross-sectional views showing an example portion of a vehicle display device 100 when viewed from different points.

In the vehicle display device 100, the first roller 210 and the second roller 220 may be configured to be movable away from each other.

The display device 1 may further include an elastic body 240 which elastically supports any one of the first roller 210 or the second roller 220 to be spaced apart from the other one.

In some implementations of the present disclosure, the second roller 220 may be configured such that the rotary shaft thereof (the second rotary shaft S2) is located at a fixed point with respect to the first frame 200, and the first roller 210 may be configured such that the rotary shaft thereof (the first rotary shaft S1) is capable of reciprocating in the upward-downward direction with respect to the first frame 200.

In some implementations, the first frame 200 may include an inner frame 270, which constitutes the interior thereof, and the first roller 210 may be coupled to the inner frame 270 such that the rotary shaft thereof (the first rotary shaft S1) is capable of reciprocating in the upward-downward direction (the Z-axis direction) with respect to the inner frame 270.

In some examples, the elastic body 240 may be coupled to the inner frame 270 so as to press the first roller 210 to move away from the second roller 220.

The elastic body 240 may be formed as a conventional coil spring. The elastic body 240 may be configured to store elastic force in the compressed state and to press the first roller 210 in this state.

In some implementations, the elastic body 240 may be configured to directly apply pressure to the first roller 210, or apply pressure to the first roller 210 by means of a separate pusher 260.

In this way, the entire driving track may be applied with a uniform tension without becoming loose, and a uniform tension may be applied to the flexible display 500.

Figure 14A:
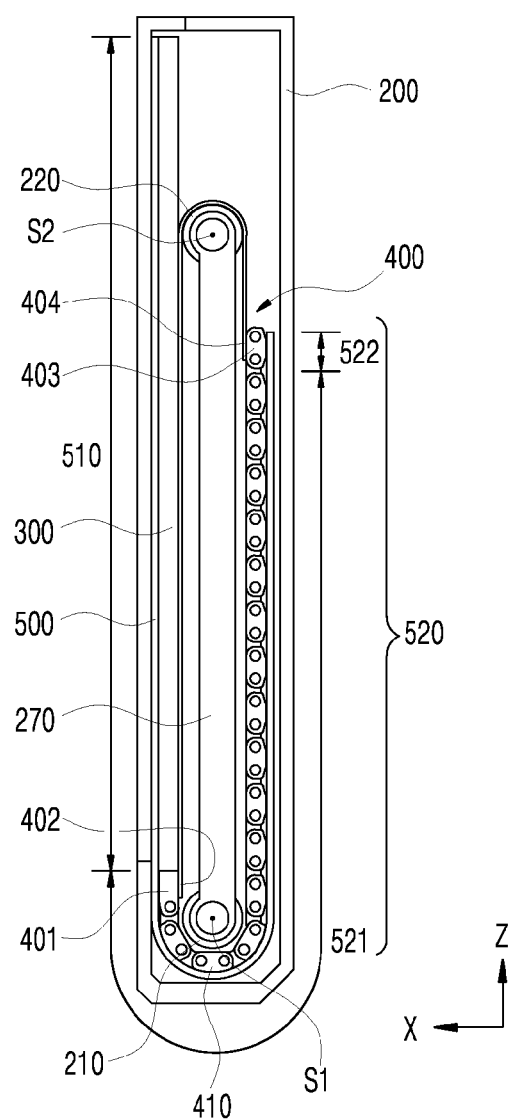
FIG. 14A is a cross-sectional view showing an example of a vehicle display device.
Figure 14B:
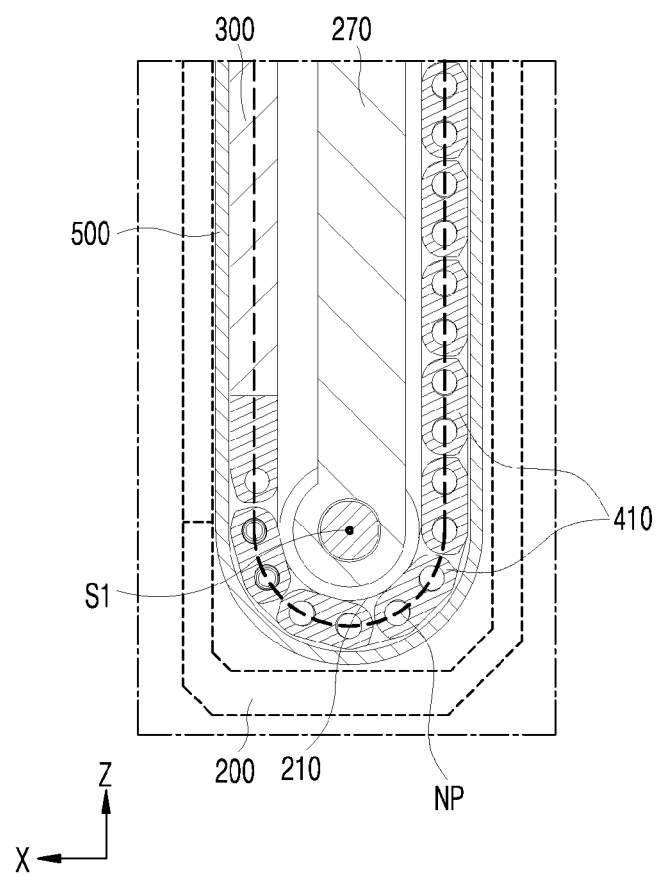
FIGS. 14B and 14C are cross-sectional views showing an example of a neutral plane of the vehicle display device, and an example of a first frame using a dotted line.
Figure 14C:
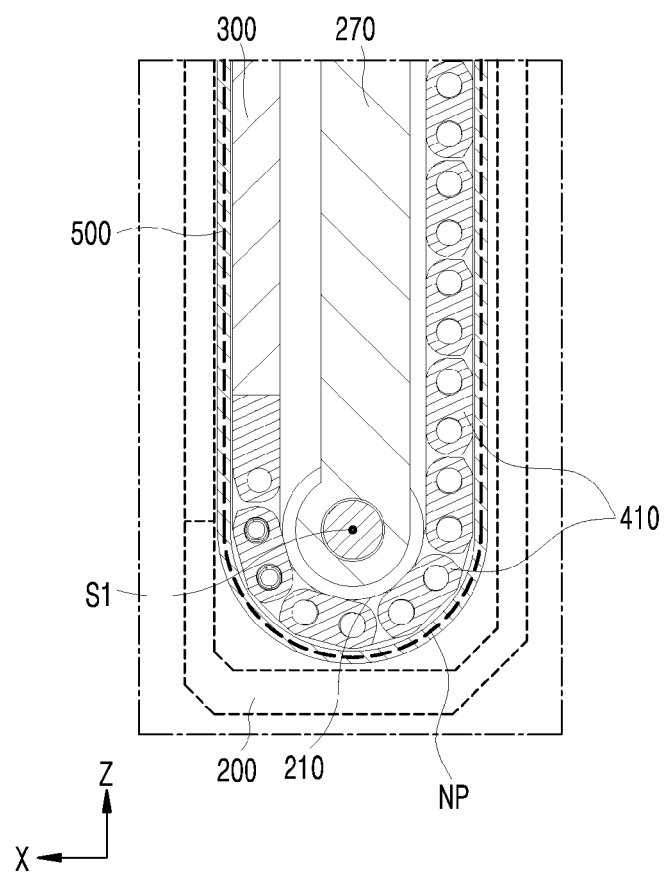

FIG. 14A is a cross-sectional view showing a vehicle display device 100, and FIGS. 14B and 14C are cross-sectional views showing an example of a neutral plane of the vehicle display device 100. In the drawings, the first frame 200 is illustrated using a dotted line.

As described above, the flexible display 500 may include a first area 510 and a second area 520.

In addition, the second area 520 may include a separated area 521 and a coupled area 522.

As described above, the first area 510 is an area that is coupled to the outer surface of the second frame 300. The first area 510 of the flexible display 500 may be in close contact with the outer surface of the second frame 300. In this case, the first area 510 of the flexible display 500 and the second frame 300 may be coupled to each other using adhesive tape or the like.

The separated area 521 is an area that extends from the first area 510 and is not coupled to the outer surface of the driving track 400. That is, the separated area 521 of the flexible display 500 may be in close contact with the driving track 400, but may not adhere to or be coupled to the driving track 400. When external force is applied, the separated area 521 of the flexible display 500 and the driving track 400 may move relative to each other.

The separated area 521 may constitute a part of the second area 520 described above, or may occupy most of the second area 520.

When the driving track 400 is configured to include the chain 410 and the guide plate 420, the separated area 521 may overlap the chain 410, excluding the first intermediate coupling 403.

The coupled area 522 extends from the separated area 521, and is coupled to the outer surface of the driving track 400. The coupled area 522 may form a distal end of the flexible display 500 which overlaps the driving track 400.

In the coupled area 522, the flexible display 500 may be closely coupled with the outer surface of the driving track 400. In this case, the coupled area 522 of the flexible display 500 and the driving track 400 may be coupled to each other using an adhesive tape.

When the driving track 400 is configured to include the chain 410 and the guide plate 420, the coupled area 522 may overlap a part of the first intermediate coupling 403 and be coupled thereto.

As described above, in the vehicle display device 100, the first area 510 of the flexible display 500 is coupled to the outer surface of the second frame 300, the separated area 521 is not coupled to the outer surface of the driving track 400, and the coupled area 522 is coupled to the outer surface of the driving track 400.

In some cases, where the separated area 521 of the flexible display 500 is coupled (fixed) to the outer surface of the driving track 400, when the flexible display 500 and the driving track 400 are bent around the first roller 210, the neutral plane NP may be located on the driving track 400 (the chain 410), and a large (excessive) amount of tensile strength may be applied to the area of the flexible display 500 that is bent around the first roller 210 (see FIG. 14B).

In some examples, in order to remove the strong tensile stress from the flexible display 500, the flexible display 500 may slide, or length compensation may be performed therefor.

In some implementations, as described above, in the separated area 521, the flexible display 500 may be configured so as not to be coupled to the outer surface of the driving track 400. Therefore, when the flexible display 500 and the driving track 400 are bent around the first roller 210, the neutral plane NP of the flexible display 500 may be located on the flexible display 500, and the tensile stress applied to the flexible display 500 which is bent around the first roller 210 may be reduced (see FIG. 14C).

Figure 15A:
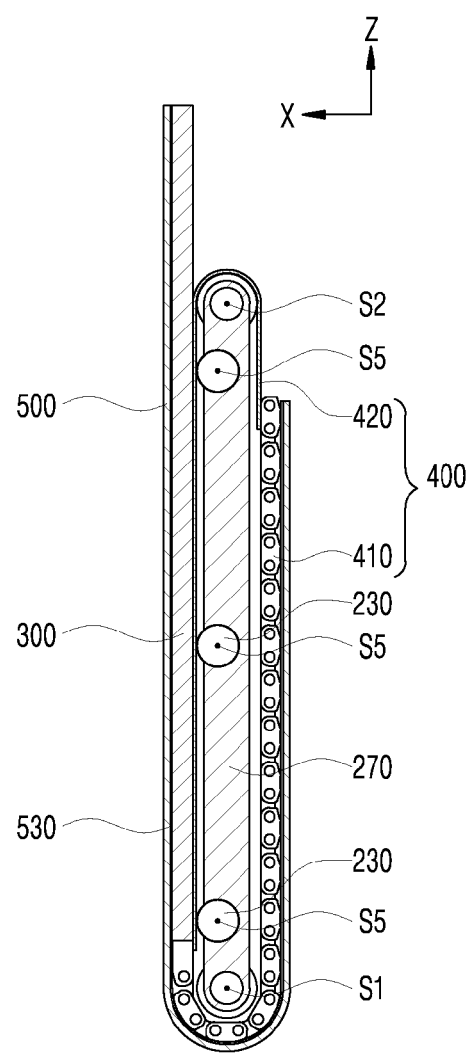
FIGS. 15A and 15B are cross-sectional views showing an example of a vehicle display device, where
Figure 15B:
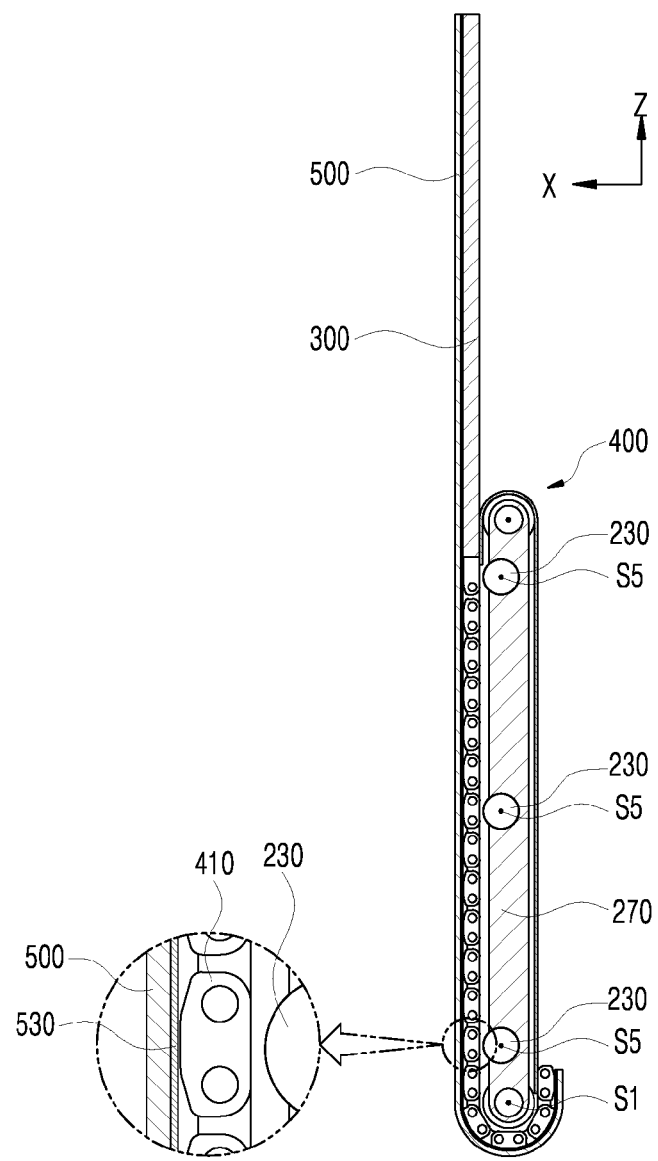

FIGS. 15A and 15B are cross-sectional views showing an example of a vehicle display device 100. FIG. 15A illustrates an example of a first state, and FIG. 15B illustrates an example of a second state.

The vehicle display device 100 may include a first magnet 230.

The first magnet 230 may be provided in a plural number, and may be coupled to the first frame 200.

The first magnets 230 may be coupled to the inner frame 270 of the first frame 200.

The first magnets 230 may be repeatedly formed in the third direction (the upward-downward direction), and may also be repeatedly formed in the second direction (the leftward-rightward direction).

When the first magnets 230 are repeatedly formed in the upward-downward direction, the intervals therebetween may be constant, and when the first magnets 230 are repeatedly formed in the leftward-rightward direction, the intervals therebetween may be constant.

Each first magnet 230 may be coupled to the inner frame 270 so as to be rotatable about a rotary shaft S5 parallel to the first rotary shaft S1.

In this case, each first magnet 230 may have a cylindrical shape overall, and the rotary shaft S5 may serve as a central axis of the cylindrical first magnet 230.

Each first magnet 230 may be formed as a permanent magnet, or may include a permanent magnet.

In the vehicle display device 100, the distance between the first magnet 230 and the transformable area 532 of the backplate 530 located in front of the first magnet 230 in the first direction (the X-axis direction) may be less than the distance between the first magnet 230 and the transformable area 532 of the backplate 530 located behind the first magnet 230 in the first direction (the X-axis direction).

The first magnet 230 and the flexible display 500 (and/or the backplate 530) may be formed such that magnetic force acts therebetween. To this end, the flexible display 500 may include a separate magnetic substance. In some cases, the magnetic substance may be uniformly dispersed over the entire area of the flexible display 500.

The first magnet 230 and the flexible display 500 (and/or the backplate 530) may be formed such that attractive force acts therebetween or such that repulsive force acts therebetween. Here, whether to use attractive force or repulsive force to maintain the flatness of the flexible display 500 may be determined depending on the surrounding structure.

When the second frame 300 moves upwards or downwards in front of the first magnet 230, magnetic force acts between the first magnet 230 and the flexible display 500 (and/or the backplate 530), and the first magnet 230 rotates about the rotary shaft thereof. Since the first magnet 230 rotates, the sliding movement (movement in the upward-downward direction) of the flexible display 500 may not be obstructed, and movement of the flexible display 500 in the forward-backward direction may be restrained. In addition, separation or looseness of the flexible display 500 may be avoided, and the flatness of the flexible display 500 may be maintained.

Figure 16A:
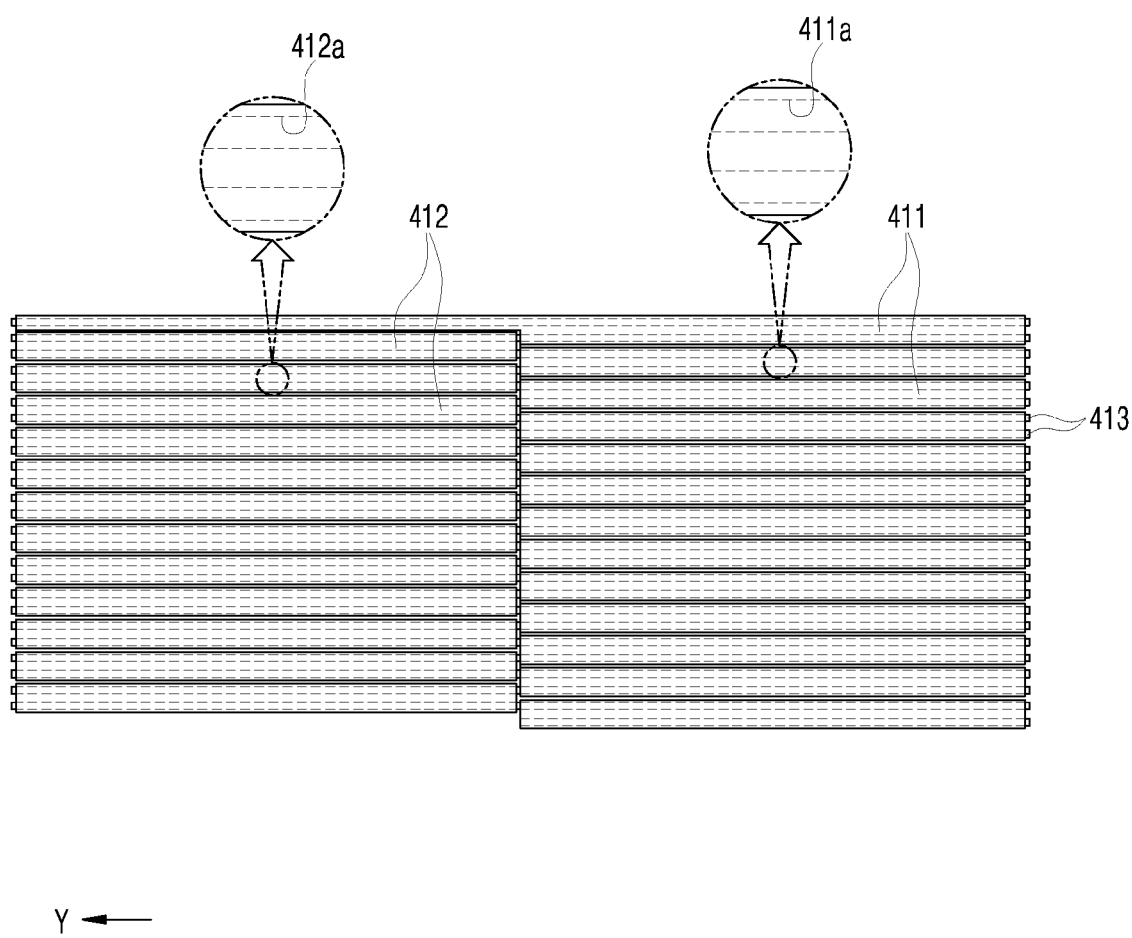
FIG. 16A is a plan view showing an example portion of a chain of a vehicle display device.
Figure 16B:
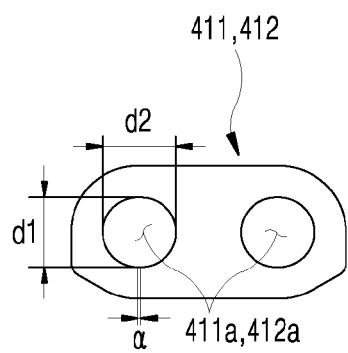
FIG. 16B is a side view of an example of a first link and an example of a second link shown in FIG. 16A.

FIG. 16A is a plan view of a portion of a chain 410 of a vehicle display device 100, and FIG. 16B is a side view of a first link 411 and a second link 412 shown in FIG. 16A.

A chain 410 which forms the driving track 400 may be configured to include a first link 411, a second link 412, and a link pin 413.

A plurality of first links 411 and a plurality of second links 412 are provided.

The plurality of first links 411 are arranged in the longitudinal direction of the driving track 400, and the plurality of second links 412 are also arranged in the longitudinal direction of the driving track 400. The first links 411 are engaged with the second links 412.

In order to fasten the first links 411 and the second links 412, a first link hole 411a is formed in the first link 411 and a second link hole 412a is formed in the second link 412, and the link pin 413 is coupled to the first link hole 411a and the second link hole 412a by being inserted therein.

The first link 411 and the second link 412 may relatively rotate, with the link pin 413 that fastens them serving as a rotational axis.

In the first link 411, two identical first link holes 411a are formed to be spaced apart from each other, and in the second link 412, two identical second link holes 412a are formed to be spaced apart from each other.

The link pin 413 has a circular shape in cross-section, and the second link hole 412a also has a circular shape in cross-section. In some examples, the first link hole 411a may be formed to have a long hole shape with a longer diameter in the longitudinal direction of the chain 410. For instance, the first link hole 411a may have an elongated shape having a first diameter d1 in the thickness direction of the chain and a second diameter d2 in the longitudinal direction of the chain, where the second diameter d2 may be greater than the first diameter d1.

In some examples, the second diameter d2 may be equal to a sum of the first diameter d1 and a distance a. For example, the first link hole 411a may be formed such that the second diameter d2 in the longitudinal direction may be greater than the first diameter d1 in the thickness direction by 0.2 mm.

In some examples, when the chain 410 (a combination of links) is bent, for example, when the chain 410 is wound around the first roller 210, for a smooth deformation of the chain 410, the intervals between some links may be spaced apart from each other, or the intervals between some links may be close to each other. This is because the chain 410 that is wound around the first roller 210 may not form a part of a complete circle (for example, a complete semicircle).

In the vehicle display device 100, in consideration of the above description, the first link hole 411a is formed to have a long hole shape with a longer diameter in the longitudinal direction of the chain 410, and accordingly, length compensation of the chain 410 may be achieved.

Figure 17:
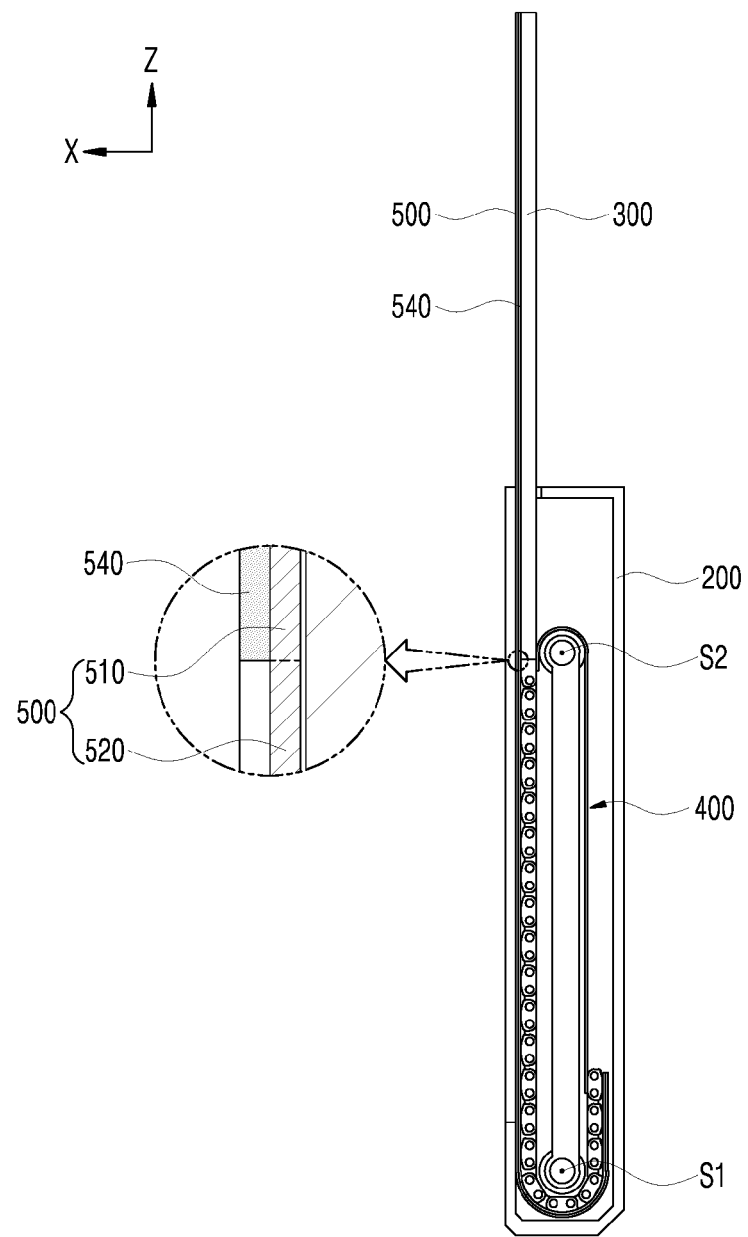
FIGS. 17 and 18 are cross-sectional views schematically showing an example of a vehicle display device.
Figure 18:
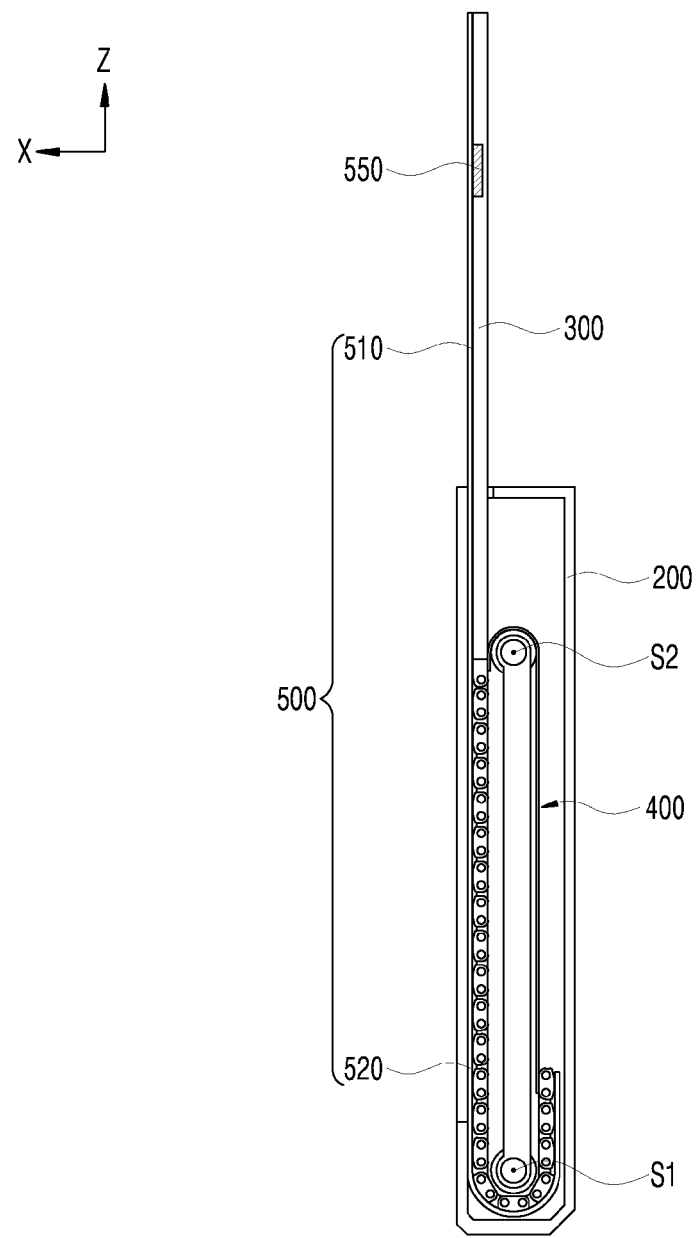

FIGS. 17 and 18 are cross-sectional views schematically showing an example of a vehicle display device 100.

In the vehicle display device 100, a touch sensor 540 may be provided in one region of the flexible display 500. The touch sensor 540 may be formed as a touch panel.

The touch sensor 540 may be disposed in the first area 510 of the flexible display 500, and the first area 510 of the flexible display 500 and the touch sensor 540 may be combined to implement a touch screen.

Since the first area 510 has a fixed shape, a touch screen may be more easily implemented when the touch sensor 540 is provided in the first area 510.

In the vehicle display device 100, an exciter 550 may be provided in the first area 510 of the flexible display 500.

In some implementations, the flexible display 500 may be vibrated so as to be used as a means for outputting sound. The exciter 550 may be attached to the rear surface of the flexible display 500, and may vibrate the flexible display 500 according to an acoustic signal so that the flexible display 500 outputs sound.

An exciter is a device for vibrating a diaphragm of a speaker. In some examples, where a diaphragm is not provided, the exciter 550 may vibrate the flexible display 500 to output sound. In some examples, the display device 100 may include a diaphragm configured to generate a sound based on vibration of the exciter.

For example, the exciter 550 may include a magnet and a coil. When current is applied to the coil of the exciter 550, the coil may generate a magnetic field having an orientation opposite to that of the magnetic field generated by the magnet of the exciter 550 within the magnetic field of the magnet, and the magnet may be moved. In some examples, the coil of the exciter 550 may be moved according to the Fleming's left hand rule within the magnetic field generated by the magnet of the exciter 550.

Based on this principle, the exciter 550 may generate a vibration, and the vibration of the exciter 550 may be transmitted to the flexible display 500 so that the flexible display 500 vibrates and outputs sound. In some examples, the exciter 550 may include a piezoelectric actuator.

In the vehicle display device 100, the exciter 550 may be provided in one region of the flexible display 500. For example, the exciter 550 may be provided on the rear surface of the first area 510 of the flexible display 500.

Since the first area 510 has a fixed shape, a sound output means may be more easily implemented when the exciter 550 is provided in the first area 510.

Figure 19A:
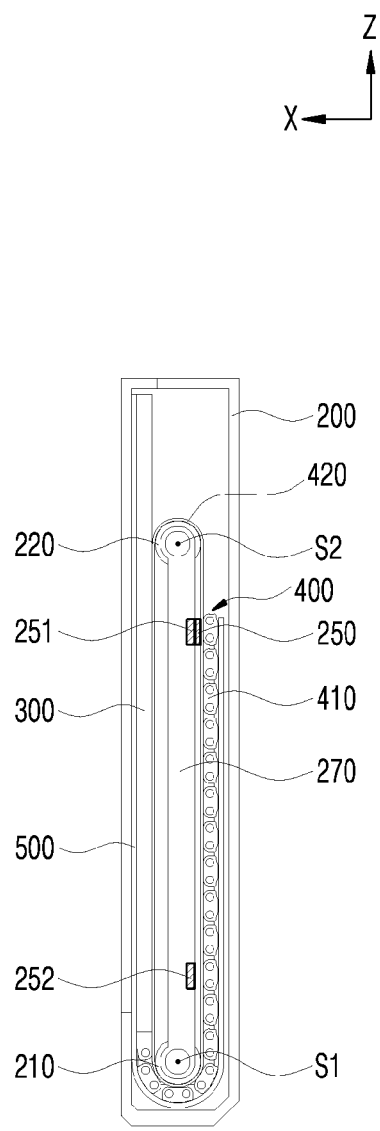
FIGS. 19A and 19B are cross-sectional views schematically showing an example of a vehicle display device, where
Figure 19B:
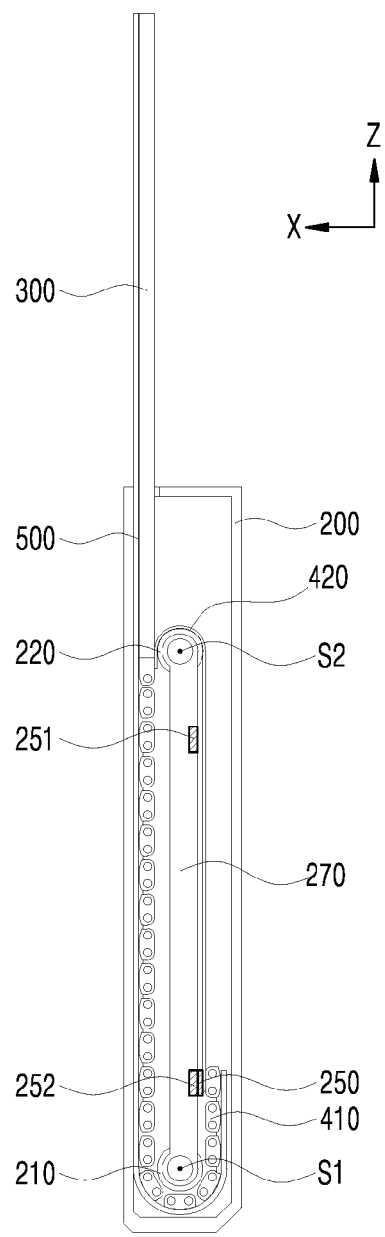

FIGS. 19A and 19B are cross-sectional views schematically showing an example of a vehicle display device 100. FIG. 19A illustrates an example of a first state, and FIG. 19B illustrates an example of a second state.

The vehicle display device 100 may include a second magnet 250 that is coupled to the driving track 400, and a first Hall sensor 251 and a second Hall sensor 252 that are coupled to the first frame 200.

In some examples, the second magnet 250 may be a permanent magnet. In other examples, the second magnet 250 may be an electromagnet.

The first Hall sensor 251 and the second Hall sensor 252 may be formed as a typical Hall sensor. The first Hall sensor 251 and the second Hall sensor 252 may sense a change in the magnetic field when the second magnet 250 moves close thereto or away therefrom, and may sense movement of the driving track 400 based thereon.

In some implementations, the first Hall sensor 251 may sense the second magnet 250 in the first state.

In addition, the first Hall sensor 251 may sense the second magnet 250 when the vehicle display device 100 changes from the second state to the first state.

The second Hall sensor 252 may sense the second magnet 250 in the second state.

In addition, the second Hall sensor 252 may sense the second magnet 250 when the vehicle display device 100 changes from the first state to the second state.

In the vehicle display device 100, the rotating speed of the driving motor 620 may be controlled according to signals from the first Hall sensor 251 and the second Hall sensor 252.

For example, when the vehicle display device 100 changes from the first state to the second state and the second magnet 250 approaches the second Hall sensor 252, the rotating speed of the driving motor 620 may be reduced. When the second magnet 250 moves as close as possible to the second Hall sensor 252, the rotation of the driving motor 620 may be stopped.

In addition, when the vehicle display device 100 changes from the second state to the first state and the second magnet 250 approaches the first Hall sensor 251, the rotating speed of the driving motor 620 may be reduced. When the second magnet 250 moves as close as possible to the first Hall sensor 251, the rotation of the driving motor 620 may be stopped.

Accordingly, it is possible to effectively limit the range within which the screen of the flexible display 500 is capable of expanding.

In addition, the speed of the driving motor 620 may be controlled to be different depending on the time point at which the expansion of the screen of the flexible display 500 is started, the time point at which the expansion of the screen is completed, the time point at which the contraction of the screen is started, and the time point at which the contraction of the screen is completed, thereby enabling smooth and rapid operation of the vehicle display device 100.

While the specific exemplary implementations of the present disclosure have been described above and illustrated, it will be understood by those skilled in the art that the present disclosure is not limited to the described exemplary implementations, and various modifications and alterations may be made without departing from the spirit and the scope of the present disclosure. Therefore, the scope of the present disclosure is not limited to the above-described exemplary implementations, but shall be defined by the technical thought as recited in the following claims.

What is claimed is:

1. A display device for a vehicle, comprising:
a first frame configured to be coupled to a dashboard of the vehicle;
a first roller coupled to the first frame and configured to rotate about a first rotary shaft;
a second roller located vertically above the first roller and coupled to the first frame, the second roller being configured to rotate about a second rotary shaft that extends parallel to the first rotary shaft;
a driving track disposed around the first roller and the second roller, at least a portion of the driving track being configured to bend;
a second frame coupled to the driving track and configured to reciprocate upward and downward relative to the first frame;
a flexible display having a first portion coupled to the second frame and a second portion coupled to the driving track, the flexible display being configured to receive power from the vehicle; and
an actuator configured to receive power from the vehicle and to move the second frame upward and downward relative to the first frame.

2. The display device of claim 1, wherein a lower portion of the first frame is configured to be coupled to a portion of the dashboard, and
wherein an upper end of the first frame and an upper end of the second frame are, based the first frame being coupled to the dashboard, located at a higher position than the portion of the dashboard.

3. The display device of claim 2, wherein the lower portion of the first frame is configured to be rotatably coupled to the dashboard.

4. The display device of claim 1, wherein a rear surface of the first frame is configured to be coupled to a portion of the dashboard, and
wherein the second frame is configured to, based on the first frame being coupled to the dashboard, move relative to the first frame between (i) a first state in which an upper end of the second frame is located vertically below the portion of the dashboard and (ii) a second state in which the upper end of the second frame is located vertically above the portion of the dashboard.

5. The display device of claim 1, wherein the flexible display comprises:
a first area that overlaps with a first surface of the second frame facing a rear side of the vehicle; and
a second area that extends from the first area and overlaps with an outer surface of the driving track, and
wherein the display device is configured to, based on movement of the second frame relative to the first frame, change a size of exposed portions of the first area and the second area that face the rear side of the vehicle.

6. The display device of claim 1, wherein the second frame comprises a first gear disposed at a second surface of the second frame that faces a front side of the vehicle, the first gear having teeth arranged along an upward-downward direction, and
wherein the actuator comprises:
a driving gear engaged with the first gear; and
a driving motor coupled to the first frame and configured to rotate the driving gear.

7. The display device of claim 1, wherein the driving track comprises:
a first coupling disposed at a first end of the driving track and coupled to a lower end of the second frame; and
a second coupling disposed at a second end of the driving track and coupled to the second frame, the second coupling being disposed vertically above the first coupling.

8. The display device of claim 1, wherein the driving track comprises:
a first coupling disposed at a first end of the driving track and coupled to a lower end of the second frame; and
a second coupling disposed at a second end of the driving track and coupled to the lower end of the second frame.

9. The display device of claim 1, wherein the driving track comprises:
a chain coupled to a lower end of the second frame, the chain comprising a plurality of links connected to one another and configured to rotate about respective rotary shafts parallel to the first rotary shaft; and
a guide plate comprising an elastic metal plate, the guide plate having a first end portion connected to the chain and a second end portion coupled to the second frame.

10. The display device of claim 9, wherein the chain comprises:
a first link that defines a first link hole;
a second link that defines a second link hole; and
a link pin that is inserted into the first link hole and the second link hole and connects the first link to the second link, and
wherein the first link hole has an elongated shape having a first diameter in a thickness direction of the chain and a second diameter in a longitudinal direction of the chain, the second diameter being greater than the first diameter.

11. The display device of claim 9, wherein the guide plate defines a plurality of first through-holes formed to be elongated in a direction parallel to the first rotary shaft.

12. The display device of claim 1, further comprising:
a backplate coupled to a rear surface of the flexible display, the backplate comprising an elastic metal plate, wherein the backplate has:
a fixed area configured to overlap with the second frame; and
a transformable area configured to overlap with the driving track, the transformable area defining a plurality of through-holes formed to be elongated in a direction parallel to the first rotary shaft.

13. The display device of claim 12, further comprising a plurality of first magnets coupled to the first frame,
wherein the transformable area has a front portion located forward relative to the first magnets and a rear portion located rearward relative to the first magnets, and
wherein a distance between the first magnets and the front portion of the transformable area is less than a distance between the first magnets and the rear portion of the transformable area.

14. The display device of claim 1, wherein the first roller and the second roller are configured to move away from each other, and
wherein the display device further comprises an elastic body configured to elastically support one of the first roller or the second roller in a direction away from another of the first roller or the second roller.

15. The display device of claim 1, wherein the flexible display comprises:
a first area that overlaps with a first surface of the second frame facing a rear side of the vehicle; and
a second area that extends from the first area and overlaps with an outer surface of the driving track, and
wherein the second area comprises:
a separated portion that extends from the first area and is spaced apart from the outer surface of the driving track, and
a coupled portion that extends from the separated portion and is coupled to the outer surface of the driving track.

16. The display device of claim 1, wherein the flexible display comprises:
a first area that overlaps with the second frame; and
a second area that overlaps with the driving track, and
wherein the display device further comprises a plurality of support bars that are coupled to a rear surface of the second area and extend in a direction parallel to the first rotary shaft.

17. The display device of claim 1, wherein the flexible display comprises:
a first area that overlaps with the second frame; and
a second area that overlaps the driving track, and
wherein the display device further comprises a touch sensor that overlaps with the first area.

18. The display device of claim 1, wherein the flexible display comprises:
a first area that overlaps with the second frame; and
a second area overlaps with the driving track, and
wherein the display device further comprises an exciter that is disposed on a rear surface of the first area and configured to generate a vibration of the flexible display.

19. A display device for a vehicle, comprising:
a first frame configured to be coupled to a dashboard of the vehicle;
a first roller coupled to the first frame and configured to rotate about a first rotary shaft;
a second roller located vertically above the first roller and coupled to the first frame, the second roller being configured to rotate about a second rotary shaft parallel to the first rotary shaft;
a driving track disposed around the first roller and the second roller, the driving track being configured to bend;
a second frame coupled to the driving track and configured to reciprocate in an upward-downward direction relative to the first frame, the second frame comprising a first gear having teeth arranged in the upward-downward direction;
a flexible display having a first portion coupled to the second frame and a second portion coupled to the driving track, the flexible display being configured to receive power from the vehicle;
a driving gear coupled to the first frame and configured to rotate about a third rotary shaft parallel to the first rotary shaft, the driving gear being engaged with the first gear; and
a driving motor configured to receive power from the vehicle and to rotate the driving gear.

20. The display device of claim 19, wherein the second frame is configured to move relative to the first frame between a first position and a second position vertically above the first position,
wherein the display device further comprises:
a magnet coupled to the driving track;
a first Hall sensor configured to sense the magnet based on the second frame being at the first position; and
a second Hall sensor configured to sense the magnet based on the second frame being at the second position, and
wherein a rotating speed of the driving motor is controlled according to a signal from the first Hall sensor or the second Hall sensor.

* * * * *